US010923498B2

(12) United States Patent
Otsu et al.

(10) Patent No.: US 10,923,498 B2
(45) Date of Patent: Feb. 16, 2021

(54) THREE-DIMENSIONAL MEMORY DEVICE CONTAINING DIRECT SOURCE CONTACT STRUCTURE AND METHODS FOR MAKING THE SAME

(71) Applicant: SANDISK TECHNOLOGIES LLC, Addison, TX (US)

(72) Inventors: Yoshitaka Otsu, Yokkaichi (JP); Satoshi Shimizu, Yokkaichi (JP); Makoto Koto, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 15 days.

(21) Appl. No.: 16/394,233

(22) Filed: Apr. 25, 2019

(65) Prior Publication Data

US 2020/0343258 A1    Oct. 29, 2020

(51) Int. Cl.
| | |
|---|---|
| *H01L 27/115* | (2017.01) |
| *H01L 27/11582* | (2017.01) |
| *H01L 27/1157* | (2017.01) |
| *H01L 27/11524* | (2017.01) |
| *H01L 27/11556* | (2017.01) |

(52) U.S. Cl.
CPC .... *H01L 27/11582* (2013.01); *H01L 27/1157* (2013.01); *H01L 27/11524* (2013.01); *H01L 27/11556* (2013.01)

(58) Field of Classification Search
CPC .......................... H01L 27/11551–11556; H01L 27/11578–11582
See application file for complete search history.

(56) References Cited

U.S. PATENT DOCUMENTS

| | | | |
|---|---|---|---|
| 5,915,167 | A | 6/1999 | Leedy |
| 9,230,980 | B2 | 1/2016 | Rabkin et al. |
| 9,799,670 | B2 | 10/2017 | Nishikawa et al. |
| 9,805,805 | B1 | 10/2017 | Zhang et al. |
| 9,824,966 | B1 | 11/2017 | Kanakamedala et al. |
| 9,831,266 | B2 | 11/2017 | Kai et al. |
| 9,876,031 | B1 | 1/2018 | Shimizu et al. |
| 9,917,100 | B2 | 3/2018 | Zhang et al. |
| 9,985,098 | B2 | 5/2018 | Matsumoto et al. |

(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).

(Continued)

*Primary Examiner* — Eric A. Ward
(74) *Attorney, Agent, or Firm* — The Marbury Law Group PLLC

(57) ABSTRACT

A source-level sacrificial layer and an alternating stack of insulating layers and sacrificial material layers are formed over a substrate. Memory openings are formed through the alternating stack, and a source cavity is formed by removing the source-level sacrificial layer. A memory film is formally formed by a conformal deposition process, and a source contact layer is formed in the source cavity. Vertical semiconductor channels and drain regions are formed in remaining volumes of the memory openings on sidewalls of the source contact layer. A backside contact via structure is formed through the alternating stack and directly on a sidewall of the source contact layer.

20 Claims, 28 Drawing Sheets

(56) References Cited

U.S. PATENT DOCUMENTS

| | | | |
|---|---|---|---|
| 10,008,570 B2 | 6/2018 | Yu et al. | |
| 10,020,363 B2 | 7/2018 | Ogawa et al. | |
| 10,115,681 B1 | 10/2018 | Ariyoshi | |
| 10,199,359 B1 | 2/2019 | Sakakibara et al. | |
| 10,224,340 B2 | 3/2019 | Hada et al. | |
| 2015/0255481 A1* | 9/2015 | Baenninger | H01L 27/11575 438/268 |
| 2016/0343730 A1* | 11/2016 | Son | H01L 23/528 |
| 2017/0084624 A1* | 3/2017 | Lee | H01L 27/1157 |
| 2017/0148800 A1 | 5/2017 | Nishikawa et al. | |
| 2017/0148810 A1 | 5/2017 | Kai et al. | |
| 2017/0148811 A1 | 5/2017 | Zhang et al. | |
| 2018/0122904 A1 | 5/2018 | Matsumoto et al. | |
| 2018/0122905 A1 | 5/2018 | Ogawa et al. | |
| 2018/0122906 A1 | 5/2018 | Yu et al. | |
| 2018/0138195 A1* | 5/2018 | Lee | H01L 29/42348 |
| 2018/0308856 A1* | 10/2018 | Cho | H01L 27/11582 |
| 2018/0358365 A1* | 12/2018 | Lee | H01L 27/1104 |
| 2018/0366486 A1 | 12/2018 | Hada et al. | |
| 2018/0366487 A1 | 12/2018 | Okizumi et al. | |
| 2018/0374866 A1 | 12/2018 | Makala et al. | |
| 2018/0374869 A1* | 12/2018 | Kim | H01L 29/7827 |
| 2019/0006381 A1 | 1/2019 | Nakatsuji et al. | |

OTHER PUBLICATIONS

U.S. Appl. No. 15/863,205, filed Jan. 5, 2018, SanDisk Technologies LLC.
U.S. Appl. No. 15/888,714, filed Feb. 5, 2018, SanDisk Technologies LLC.
U.S. Appl. No. 15/997,194, filed Jun. 4, 2018, SanDisk Technologies LLC.
U.S. Appl. No. 16/196,026, filed Nov. 20, 2018, SanDisk Technologies LLC.
U.S. Appl. No. 16/200,115, filed Nov. 26, 2018, SanDisk Technologies LLC.
U.S. Appl. No. 16/241,171, filed Jan. 7, 2019, SanDisk Technologies LLC.
U.S. Appl. No. 16/241,221, filed Jan. 7, 2019, SanDisk Technologies LLC.
U.S. Appl. No. 16/385,010, filed Apr. 16, 2019, SanDisk Technologies LLC.
Notification of Transmittal of the International Search Report and Written Opinion of the International Search Authority for International Patent Application No. PCT/US2019/068900, dated Apr. 20, 2020, 10 pages.

\* cited by examiner

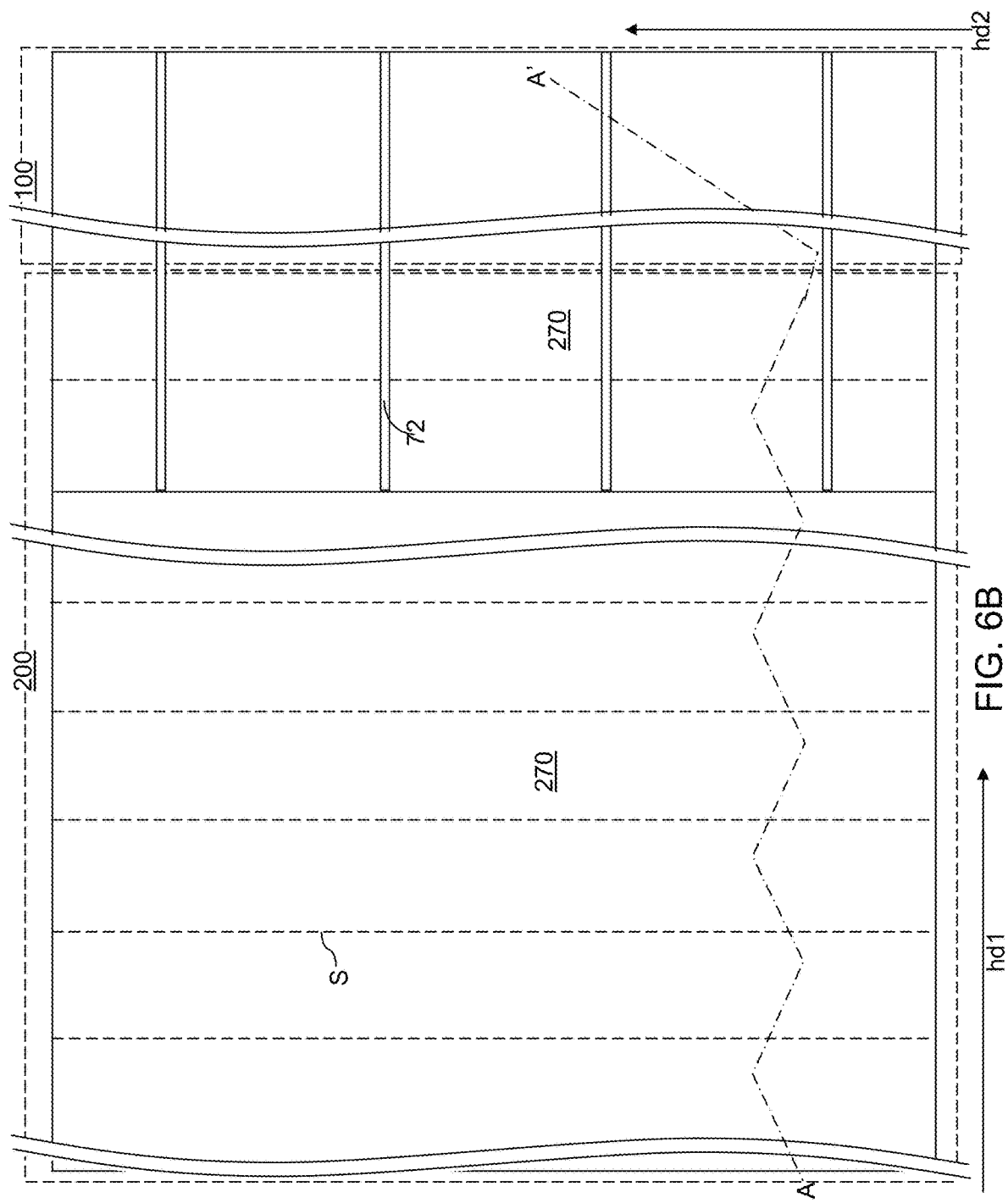

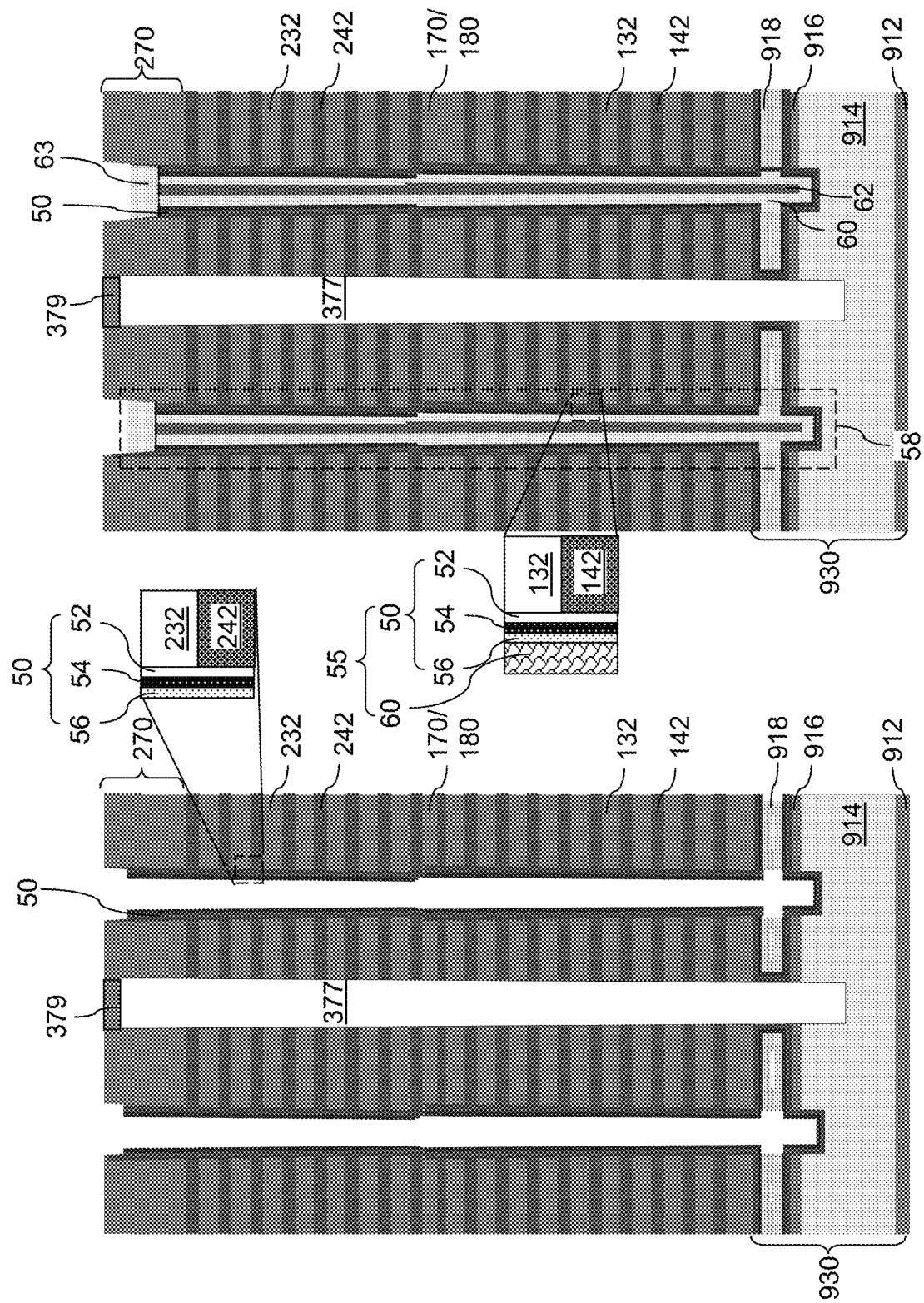

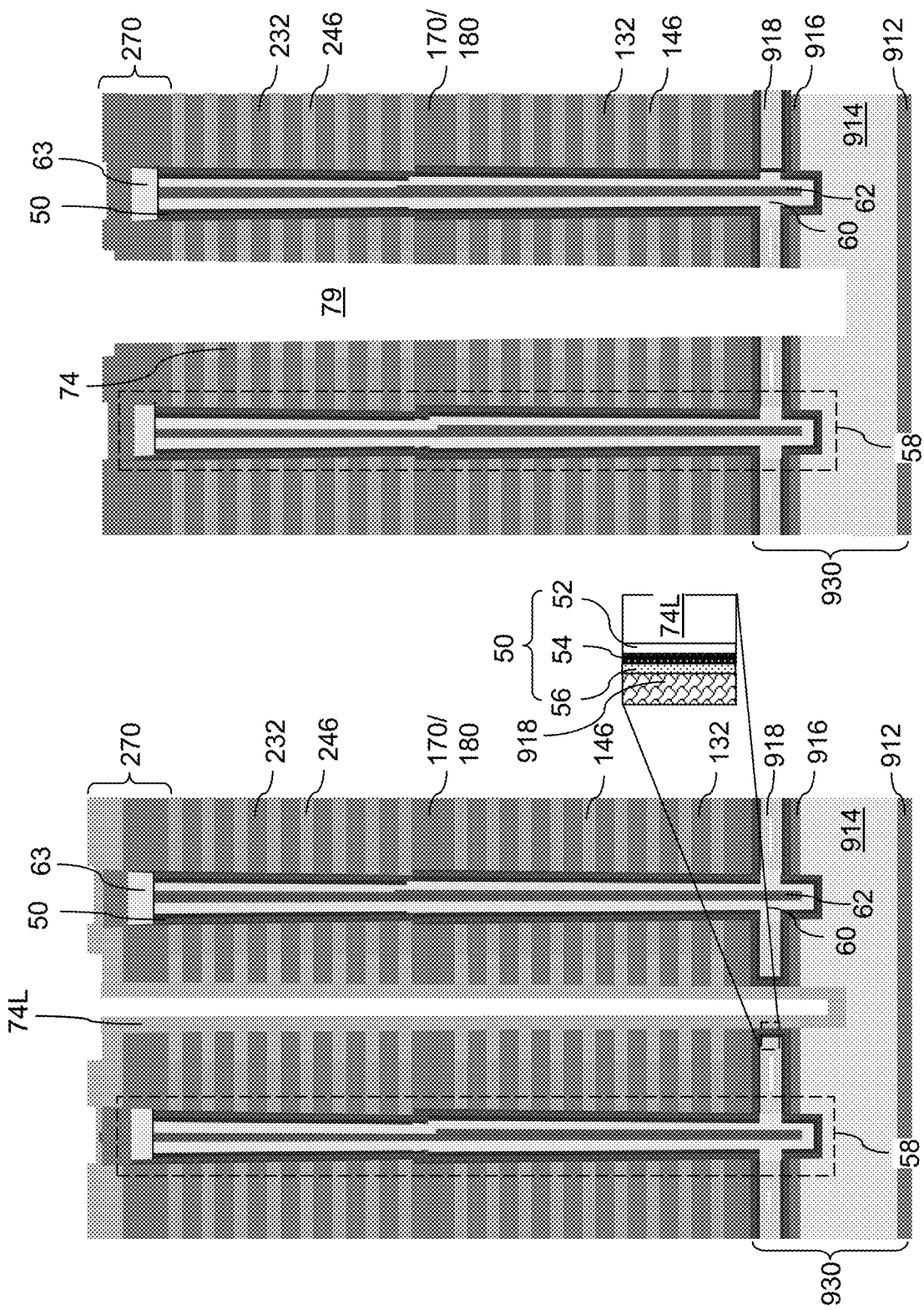

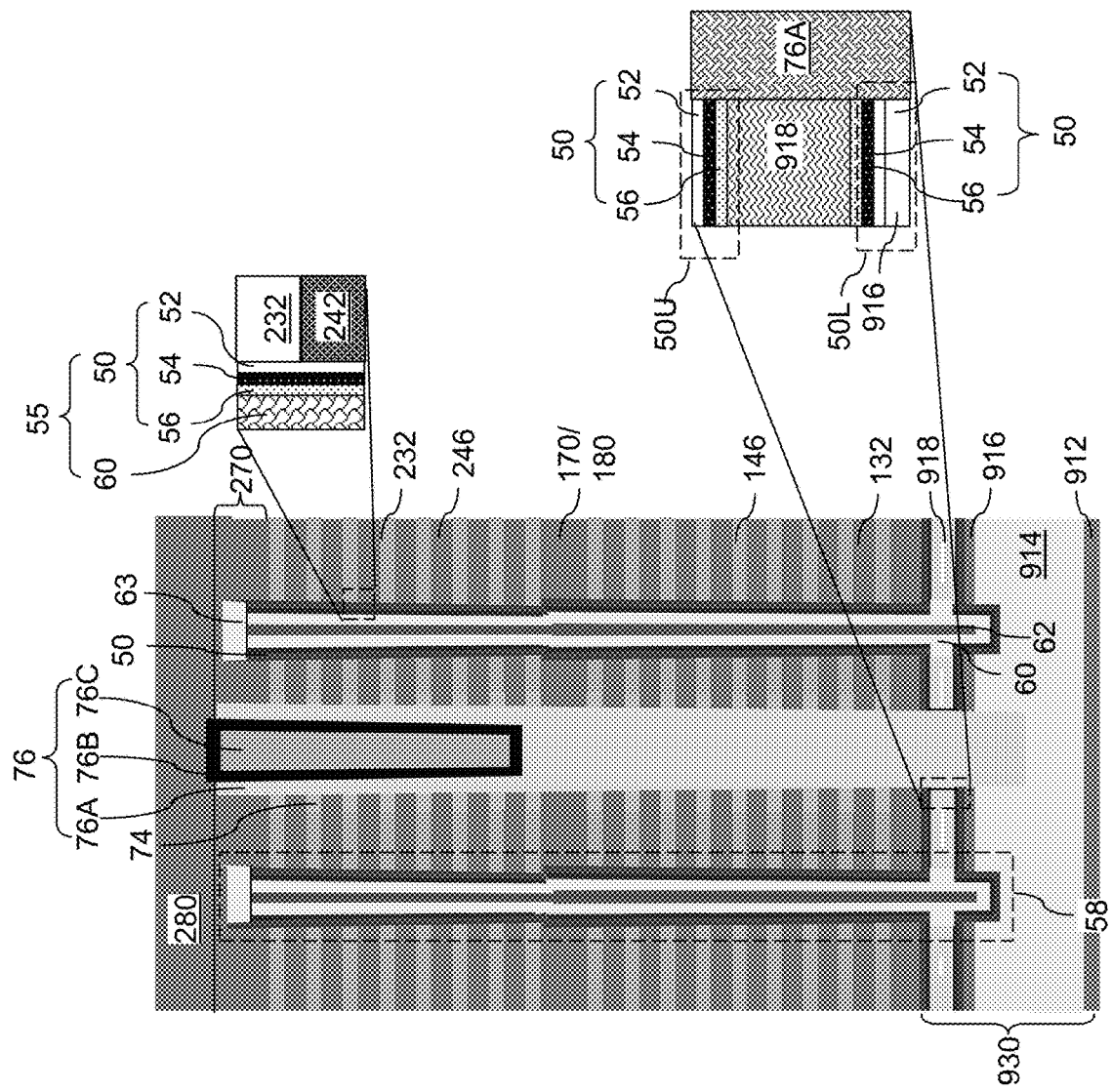

THREE-DIMENSIONAL MEMORY DEVICE CONTAINING DIRECT SOURCE CONTACT STRUCTURE AND METHODS FOR MAKING THE SAME

FIELD

The present disclosure relates generally to the field of semiconductor devices, and particular to a method of forming a direct source contact structure for a three-dimensional memory device and a structure formed by the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers located over a substrate; source-level material layers located between the substrate and the alternating stack, wherein the source-level material layers comprise a source contact layer comprising a doped semiconductor material, a lower horizontal portion of a memory film underlying the source contact layer, and an upper horizontal portion of the memory film overlying the source contact layer; memory openings vertically extending through the alternating stack and extending into the source-level material layers; memory opening fill structures located in the memory openings, wherein each of the memory opening fill structures comprises a respective vertical portion of the memory film and a respective vertical semiconductor channel that contacts the source contact layer; and a backside contact via structure contacting a sidewall of the source contact layer.

According to another embodiment of the present disclosure, a method of forming a three-dimensional memory device is provided, which comprises: forming in-process source-level material layers over a substrate, wherein the in-process source-level material layers comprise a source-level sacrificial layer; forming an alternating stack of insulating layers and sacrificial material layers over the in-process source-level material layers; forming memory openings through the alternating stack and into the in-process source-level material layers; forming a source cavity by removing the source-level sacrificial layer; forming a memory film and a source contact layer in the source cavity and in the memory openings, wherein horizontal portions of the memory film and the source contact layer are formed in the source cavity and vertical portions of the memory film are formed in the memory openings; forming vertical semiconductor channels and drain regions in remaining volumes of the memory openings; and forming a backside contact via structure directly on a sidewall of the source contact layer.

BRIEF DESCRIPTION OF THE DRAWINGS

FIG. 6B is a horizontal cross-sectional of the exemplary structure along the horizontal plane B-B' of FIG. 6A. The hinged vertical plane A-A' corresponds to the plane of the schematic vertical cross-sectional view of FIG. 6A.

FIG. 15 is a schematic vertical cross-sectional view of a region of the exemplary structure after formation of a source contact layer according to an embodiment of the present disclosure.

FIG. 16 is a schematic vertical cross-sectional view of a region of the exemplary structure after formation of memory opening fill structures according to an embodiment of the present disclosure.

FIG. 23 is a schematic vertical cross-sectional view of a region of the exemplary structure after formation of a conformal insulating material layer according to an embodiment of the present disclosure.

FIG. 24 is a schematic vertical cross-sectional view of a region of the exemplary structure after formation of insulating rails according to an embodiment of the present disclosure.

FIG. 25 is a schematic vertical cross-sectional view of a region of the exemplary structure after formation of backside contact via structures and a contact-level dielectric layer according to an embodiment of the present disclosure.

DETAILED DESCRIPTION

Figure 1:
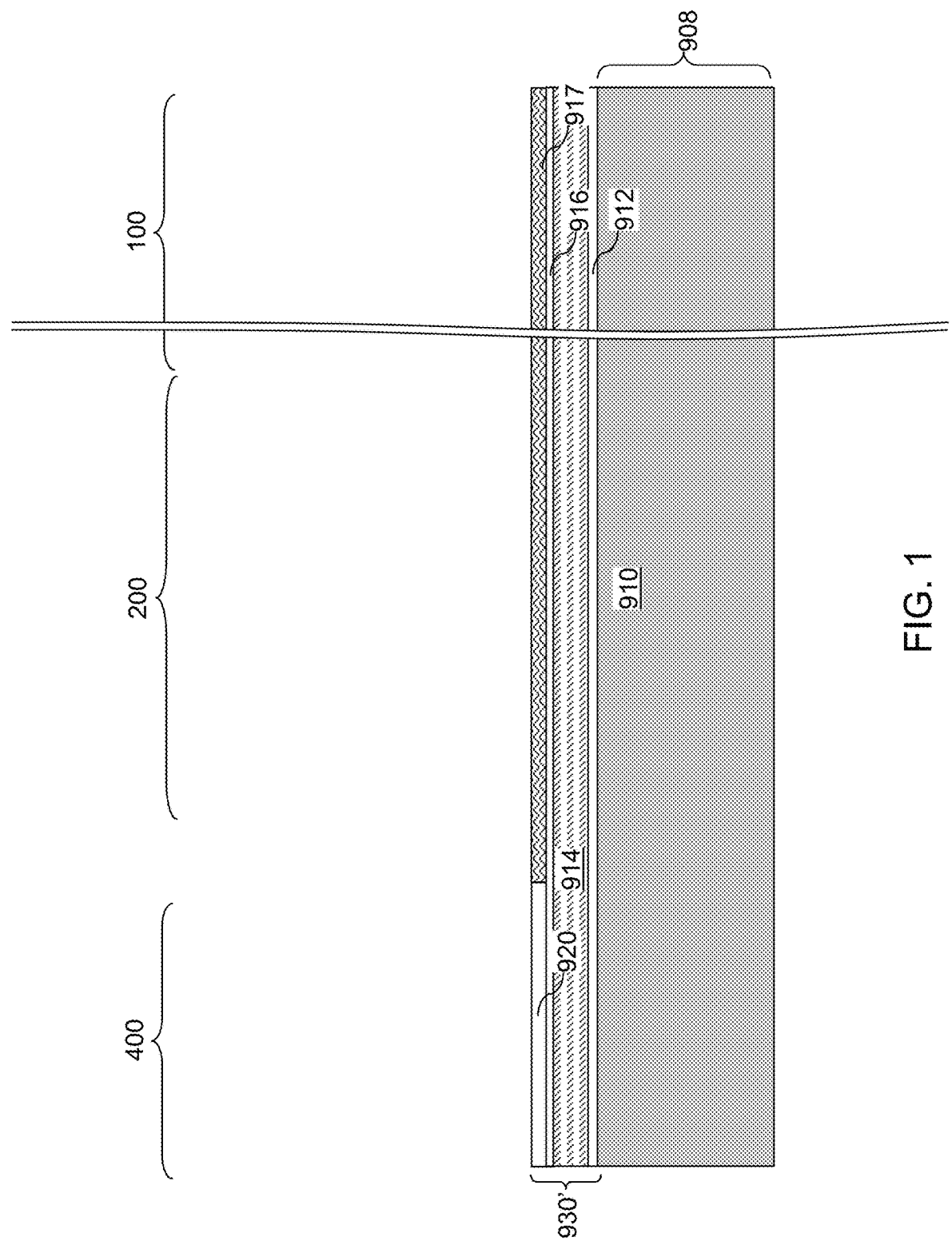
FIG. 1 is a schematic vertical cross-sectional view of an exemplary structure after formation of a spacer dielectric layer, a semiconductor material layer, a source-level dielectric layer, a source-level sacrificial layer, and a source-level isolation layer over a substrate according to an embodiment of the present disclosure.

As discussed above, the present disclosure is directed to a method of forming a direct source contact structure for a three-dimensional memory device and a structure formed by the same, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated. The exemplary structure includes a substrate 908, which may include a semiconductor substrate layer 910. In-process source-level material layers 930' may be formed over the substrate 908. The in-process source-level material layers 930' may include, from bottom to top, a spacer dielectric layer 912, a semiconductor material layer 914, a source-level dielectric layer 916, and a source-level sacrificial layer 917. The source-level sacrificial layer 917 may be patterned to form recessed regions, and may be filled with a dielectric material to form a source-level isolation layer 920. The source-level isolation layer 920 may laterally separate various patterned portions of the source-level sacrificial layer 917, and may provide mechanical support to overlying structures during subsequent replacement of the source-level sacrificial layer 917 with a source contact layer.

The spacer dielectric layer 912 may includes a dielectric material such as silicon oxide, silicon nitride, and/or a dielectric metal oxide. The thickness of the spacer dielectric layer 912 may be in a range from 3 nm to 300 nm, such as from 10 nm to 100 nm, although lesser and greater thicknesses may also be used. The semiconductor material layer 914 includes a semiconductor material such as doped silicon or a doped silicon-germanium alloy. The semiconductor material of the semiconductor material layer 914 may have a doping of a first conductivity type, which may be p-type or n-type. The thickness of the semiconductor material layer 914 may be in a range from 30 nm to 300 nm, although lesser and greater thicknesses may also be used.

The source-level dielectric layer 916 may include a dielectric material such as silicon oxide, silicon nitride, and/or a dielectric metal oxide. The thickness of the source-level dielectric layer 916 may be in a range from 3 nm to 300 nm, such as from 10 nm to 100 nm, although lesser and greater thicknesses may also be used. The source-level sacrificial layer 917 includes a sacrificial material that may be removed selective to the material of the source-level dielectric layer 916. For example, the source-level dielectric layer 916 may include undoped amorphous silicon, a silicon-germanium alloy, an organosilicate glass, or a polymer. The thickness of the source-level sacrificial layer 917 may be in a range from 30 nm to 300 nm, although lesser and greater thicknesses may also be used. The source-level isolation layer 920 includes a dielectric material such as silicon oxide, silicon nitride, and/or a dielectric metal oxide. The thickness of the source-level isolation layer 916 may be the same as, or greater than, the thickness of the source-level sacrificial layer 917.

The exemplary structure may include a memory array region 100 in which a three-dimensional array of memory elements may be subsequently formed, a staircase region 200 in which stepped surfaces of electrically conductive layers embodying word lines of the three-dimensional array of memory elements may be subsequently formed, and a peripheral region 400 in which the a dielectric material portion may be subsequently formed.

Figure 2:
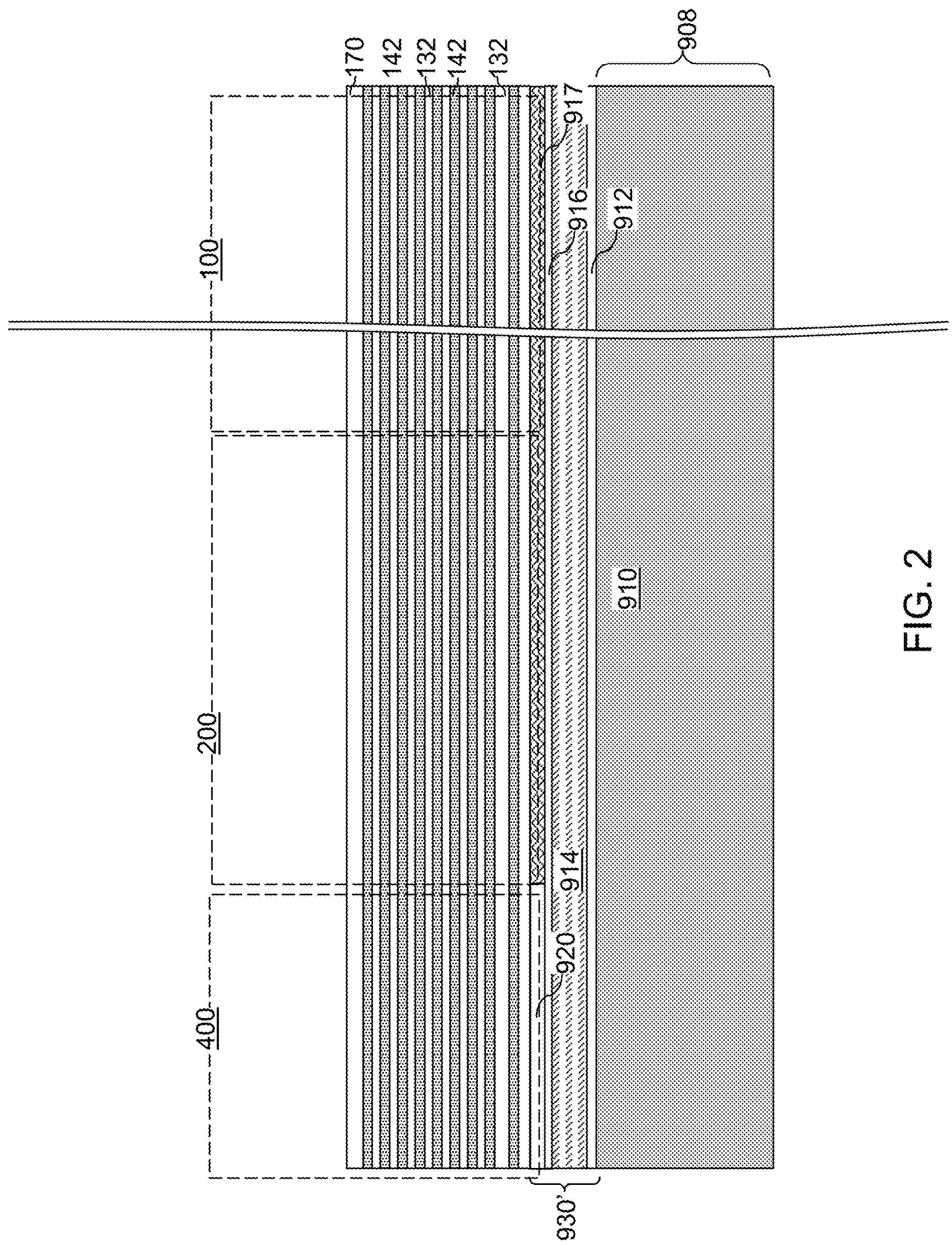
FIG. 2 is a schematic vertical cross-sectional view of the exemplary structure after formation of a first-tier alternating stack of first insulating layers and first spacer material layers according to an embodiment of the present disclosure.

Referring to FIG. 2, an alternating stack of first material layers and second material layers may be subsequently formed. Each first material layer may include a first material, and each second material layer may include a second material that is different from the first material. In embodiments in which at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. An alternating plurality of first insulating layers 132 and first sacrificial material layers 142 may be formed over the semiconductor material layer 914. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first alternating stack (132, 142). The first insulating cap layer 170 may include a dielectric material, which may be any dielectric material that may be used for the first insulating layers 132. In one embodiment, the first insulating cap layer 170 may include the same dielectric material as the first insulating layers 132. The thickness of the first insulating cap layer 170 may be in a range from 20 nm to 300 nm, although lesser and greater thicknesses may also be used.

Figure 3:
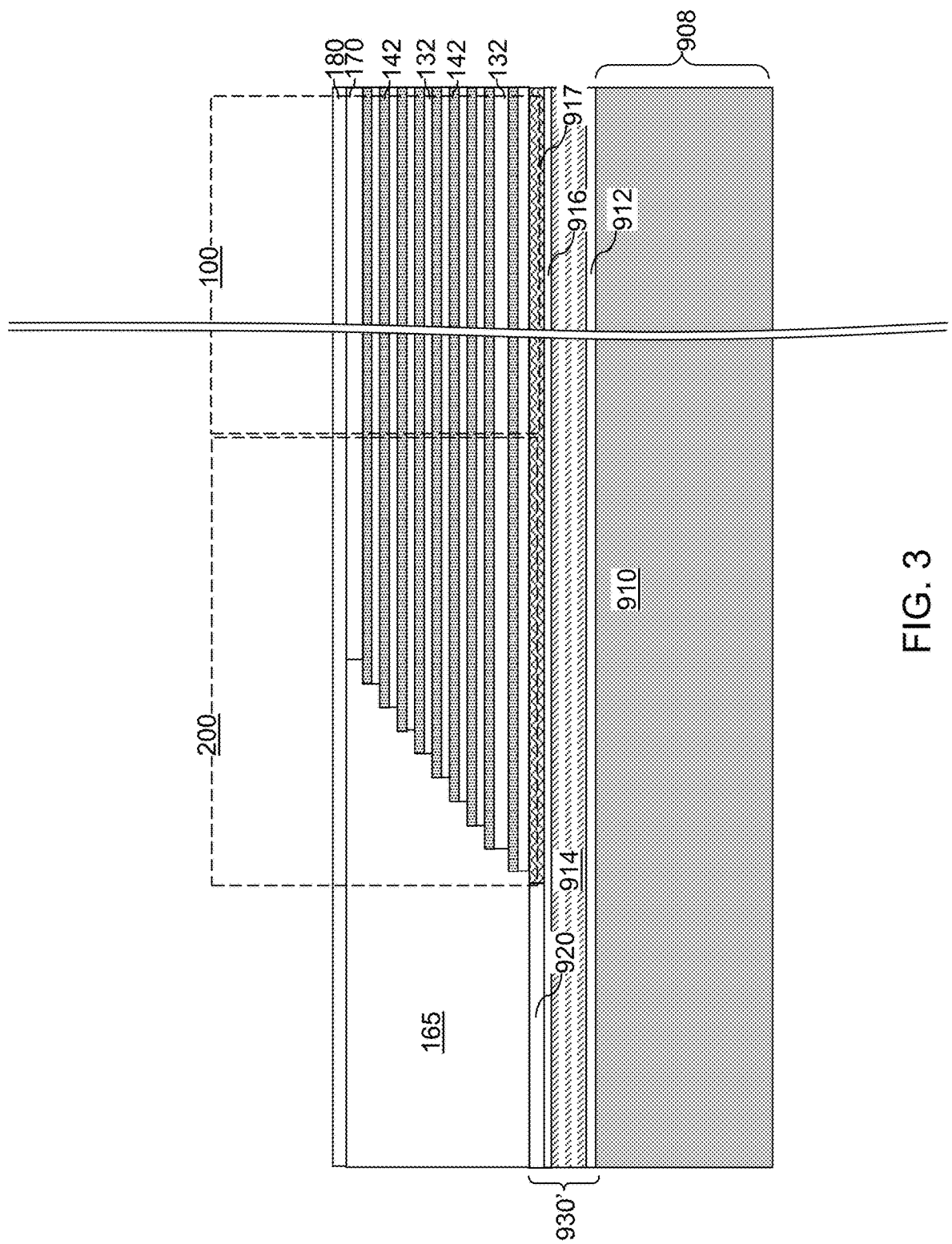
FIG. 3 is a schematic vertical cross-sectional view of the exemplary structure after patterning a first-tier staircase region, a first stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which first stepped surfaces may be formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 may include a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
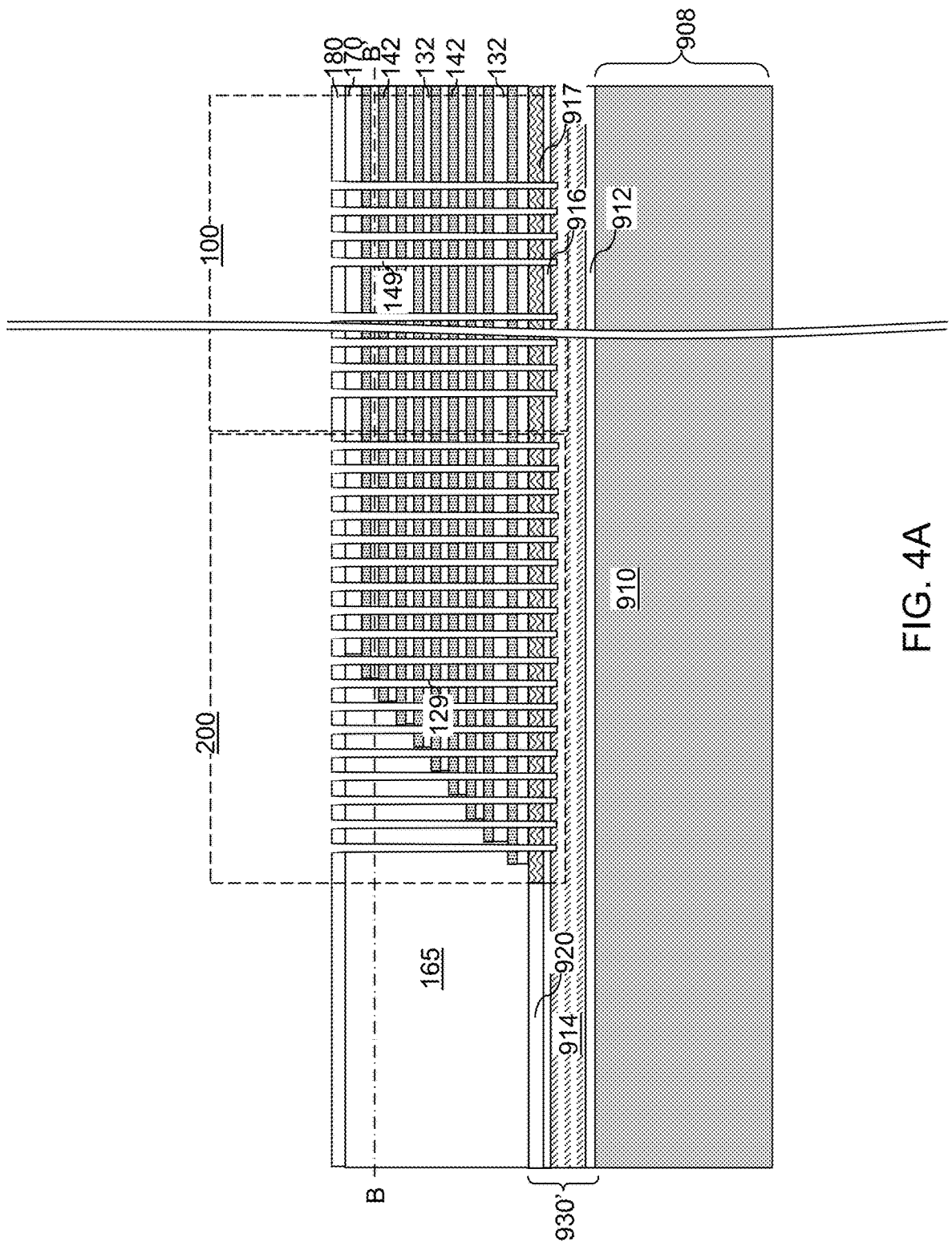
FIG. 4A is a schematic vertical cross-sectional view of the exemplary structure after formation of first-tier memory openings and first-tier support openings according to an embodiment of the present disclosure.
Figure 4B:
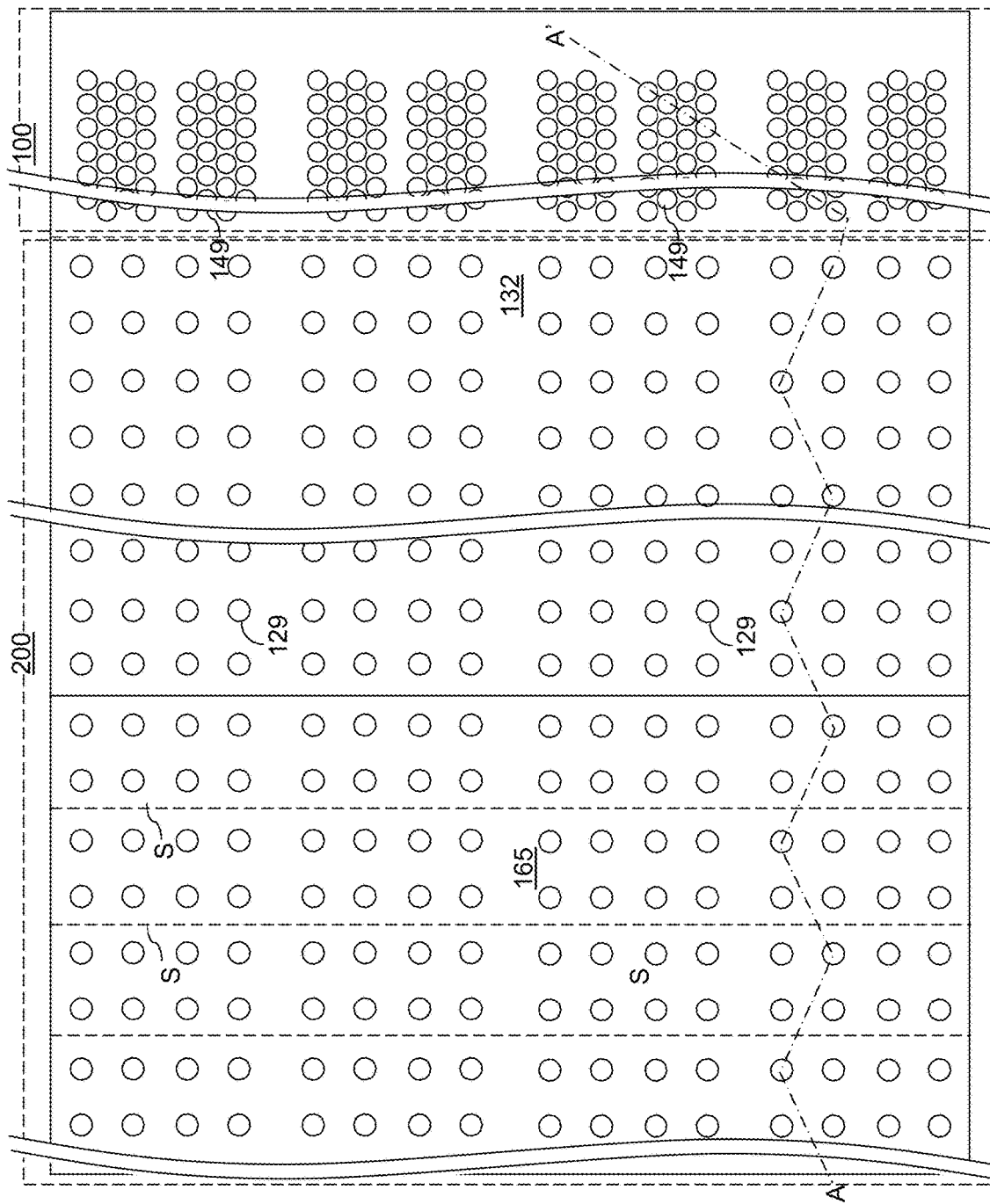
FIG. 4B is a horizontal cross-sectional view of the exemplary structure of FIG. 4A. The hinged vertical plane A-A' corresponds to the plane of the schematic vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the semiconductor material layer 914. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the semiconductor material layer 914 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 may be openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149. The first-tier memory openings 149 may extend through the first alternating stack (132, 142), the source-level sacrificial layer 917, and the source-level dielectric layer 916, and may extend into an upper portion of the semiconductor material layer 914.

The first-tier support openings 129 may be openings that are formed in the staircase region 200. A subset of the first-tier support openings 129 that is formed through the first stepped dielectric material portion 165 may be formed through a respective horizontal surface of the first stepped surfaces. The first-tier support openings 129 may extend through the first alternating stack (132, 142), the source-level sacrificial layer 917, and the source-level dielectric layer 916, and may extend into an upper portion of the semiconductor material layer 914.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4/O_2$/Ar etch). The sidewalls of the various first-tier openings (149, 129) may be substantially vertical, or may be tapered. In one embodiment, the terminal portion of the anisotropic etch process may include an overetch step that etches into an upper portion of the semiconductor material layer 914. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
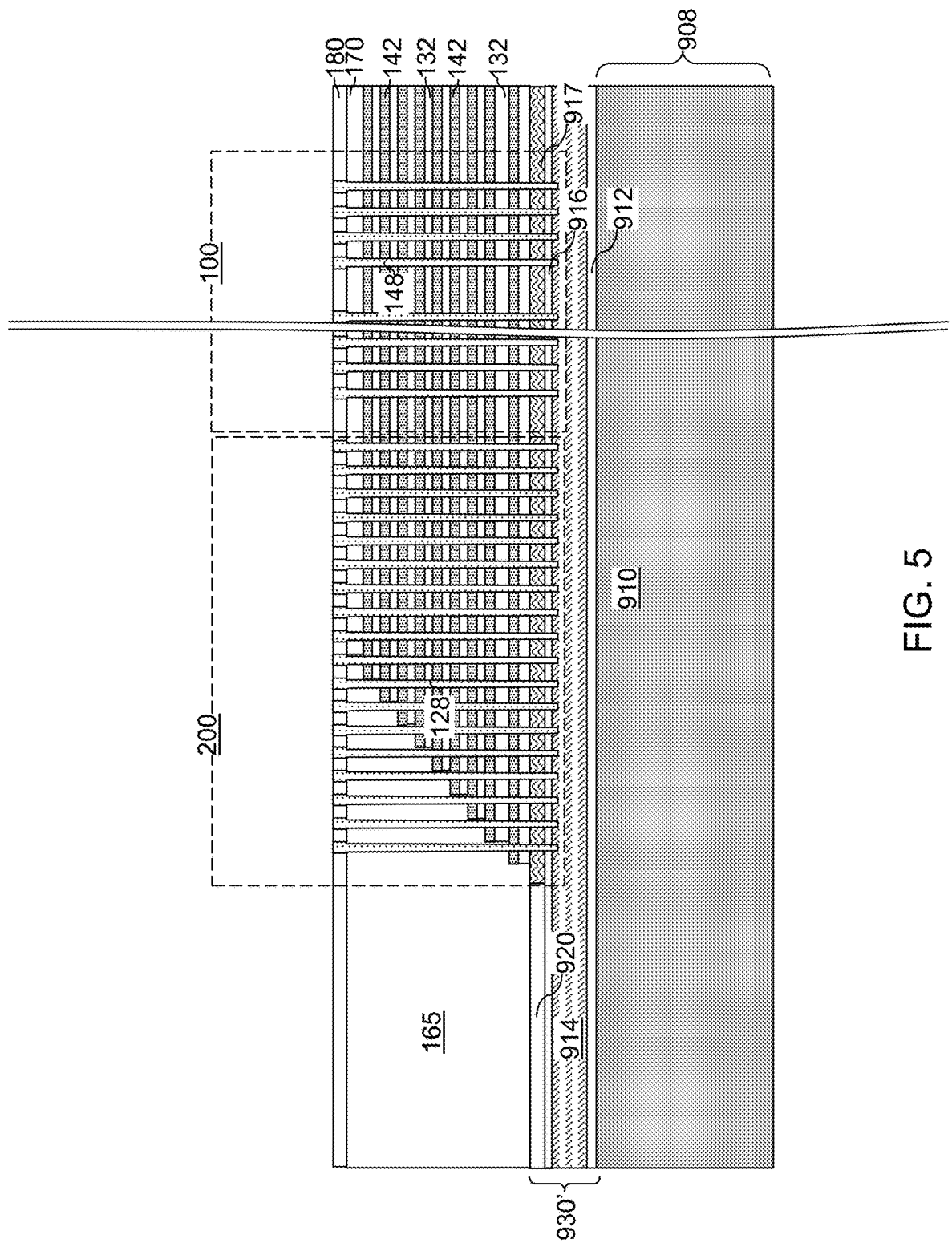
FIG. 5 is a schematic vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) may be concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6A:
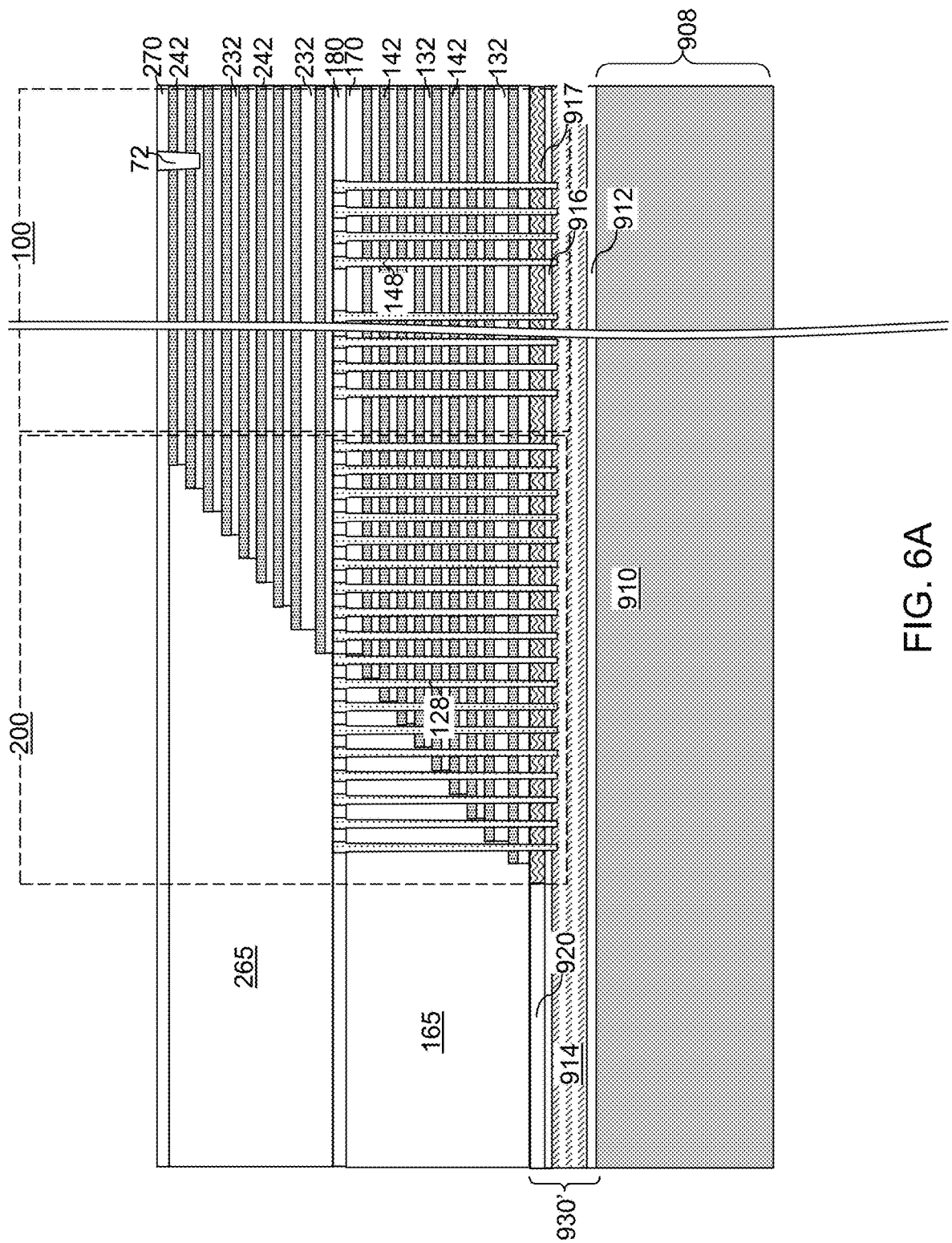
FIG. 6A is a schematic vertical cross-sectional view of the exemplary structure after formation of a second-tier alternating stack of second insulating layers and second spacer material layers, second stepped surfaces, and a second stepped dielectric material portion according to an embodiment of the present disclosure.

Referring to FIGS. 6A and 6B, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the semiconductor material layer 914, and at least one stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 may include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7:
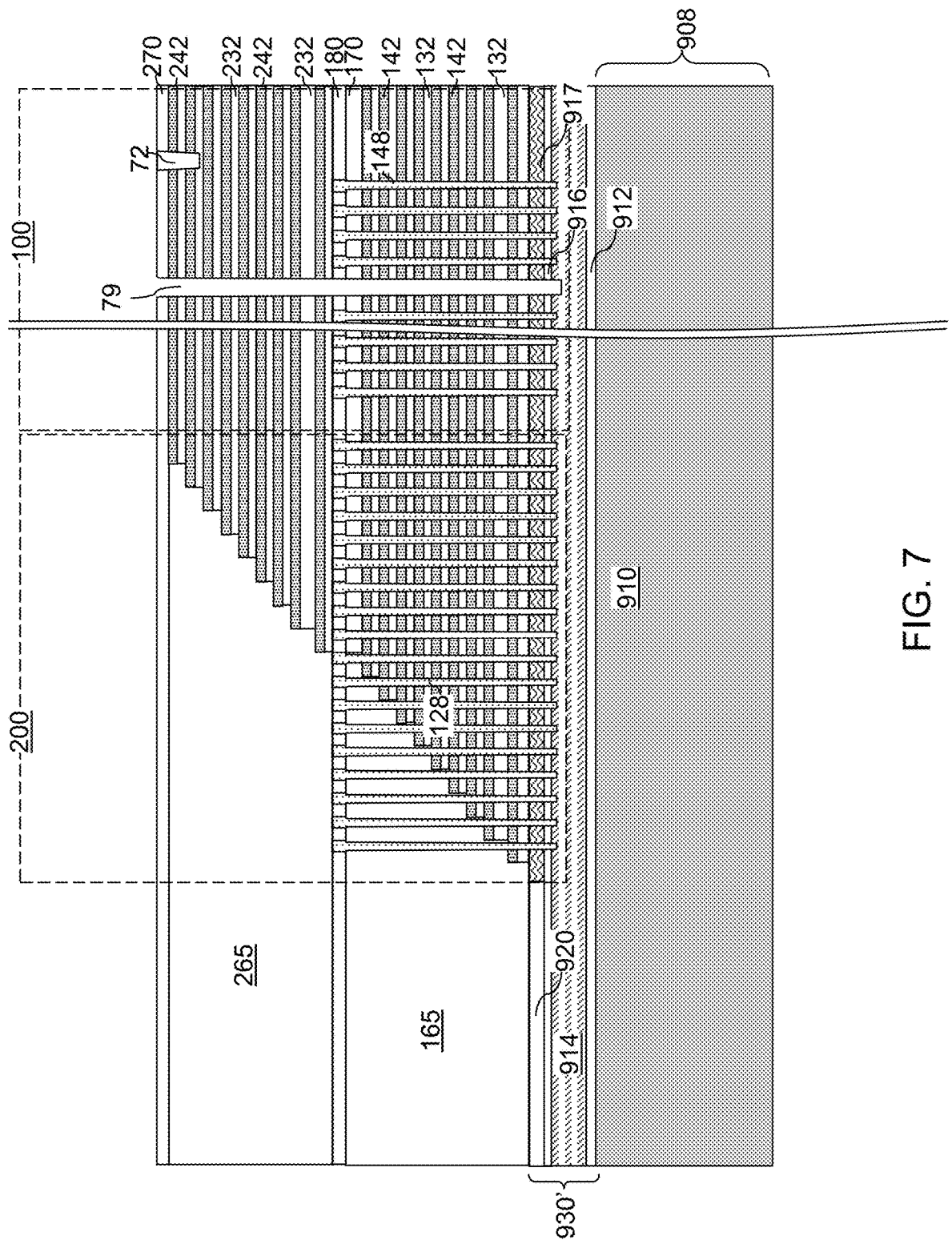
FIG. 7 is a schematic vertical cross-sectional view of the exemplary structure after formation of backside trenches according to an embodiment of the present disclosure.

Referring to FIG. 7, a photoresist layer (not shown) may be applied over the exemplary structure and may be lithographically patterned to form line-shaped openings. The line-shaped openings may laterally extend along a first horizontal direction that is perpendicular to vertical steps of the first insulating layers 132 and the first sacrificial material layers 142 in the staircase region 200. An anisotropic etch may be performed to transfer the pattern of the line-shaped openings in the photoresist layer through the second alternating stack (232, 242), the first alternating stack (132, 142), the source-level sacrificial layer 917, the source-level dielectric layer 916, and an upper portion of the semiconductor material layer 914 to form backside trenches 79. The backside trenches 79 may laterally extend along the first horizontal direction with a uniform width, and may be formed in areas in which the sacrificial first-tier opening fill portions (148, 128) are not present. In an alternative embodiment, the backside trenches 79 may be formed after the step shown in FIG. 16 which is described below.

Figure 8A:
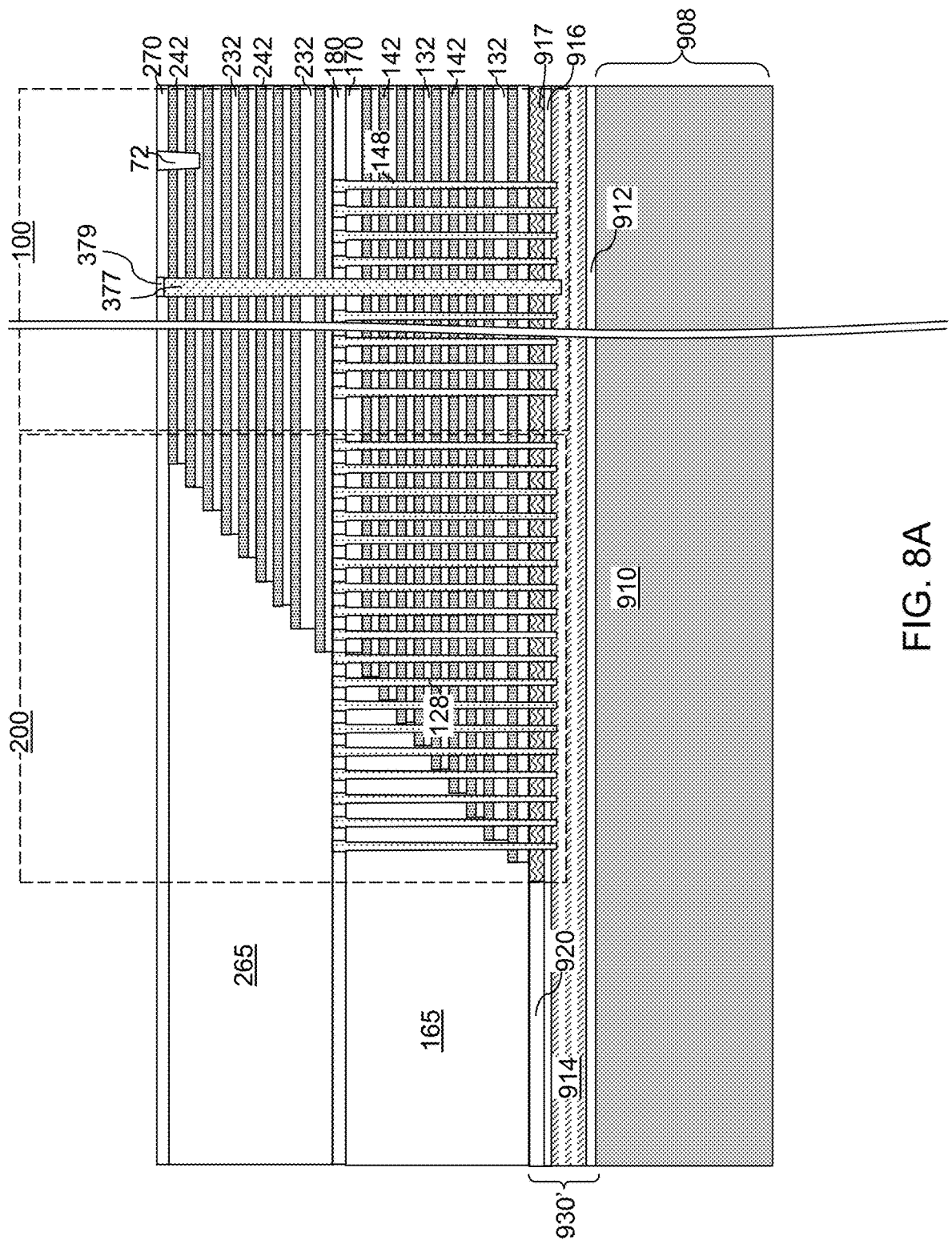
FIG. 8A is a schematic vertical cross-sectional view of the exemplary structure after formation of sacrificial backside trench fill structures according to an embodiment of the present disclosure.
Figure 8B:
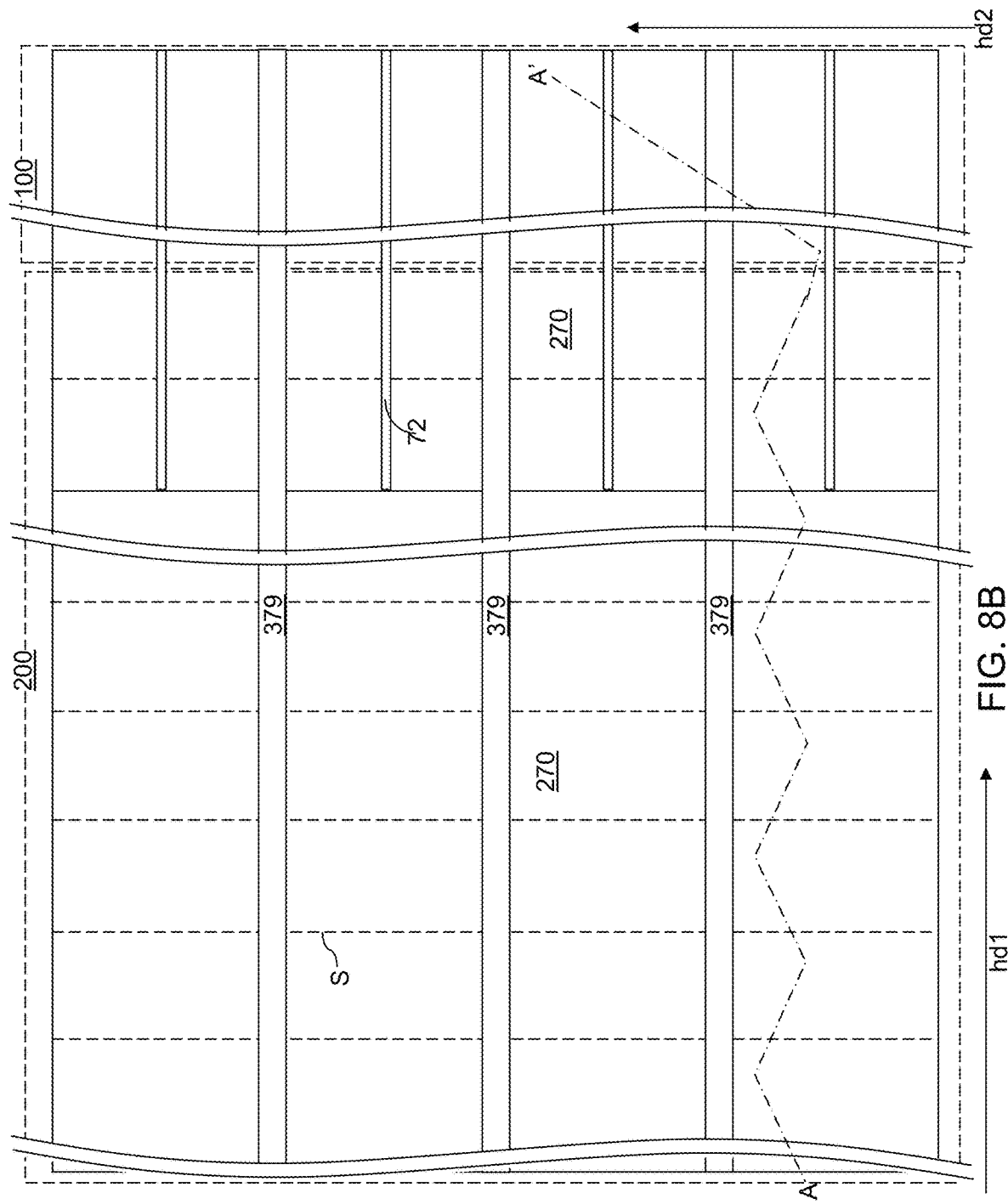
FIG. 8B is a horizontal cross-sectional of the exemplary structure along the horizontal plane B-B' of FIG. 8A. The hinged vertical plane A-A' corresponds to the plane of the schematic vertical cross-sectional view of FIG. 8A.

Referring to FIGS. 8A and 8B, a sacrificial fill material may be deposited in the backside trenches 79, and excess portions of the sacrificial fill material may be removed from above the top surface of the second insulating cap layer 270. Each remaining portion of the sacrificial fill material in the backside trenches 79 constitutes a sacrificial backside trench fill structure 377. The sacrificial fill material of the sacrificial backside trench fill structures 377 may include amorphous silicon, a silicon-germanium alloy, organosilicate glass, amorphous carbon or diamond-like carbon, or a polymer material. In case the sacrificial fill material of the sacrificial backside trench fill structures 377 is the same as the material of the source-level sacrificial layer 917, a sacrificial liner having a different composition may be formed before formation of the sacrificial backside trench fill structures 377. For example, if the sacrificial backside trench fill structures 377 may include undoped amorphous silicon, a sacrificial liner including a dielectric material such as silicon oxide and/or silicon nitride may be formed on sidewalls of the backside trenches 79 before formation of the sacrificial backside trench fill structures 377. Optionally, a dielectric cap structure 379 may be formed on a top surface of each sacrificial backside trench fill structure 377. For example, if the sacrificial backside trench fill structures 377 include amorphous silicon, an oxidation process may be performed to convert a topmost portion of each sacrificial backside trench fill structure 377 into a dielectric cap structure 379 including silicon oxide. The thickness of each dielectric cap structure 379 may be in a range from 5 nm to 50 nm, although lesser and greater thicknesses may also be used. In the alternative embodiment, if the backside trenches 79 may be formed after the step shown in FIG. 16, then the sacrificial backside trench fill structure 377 and the dielectric cap structure 379 may be omitted.

Figure 9A:
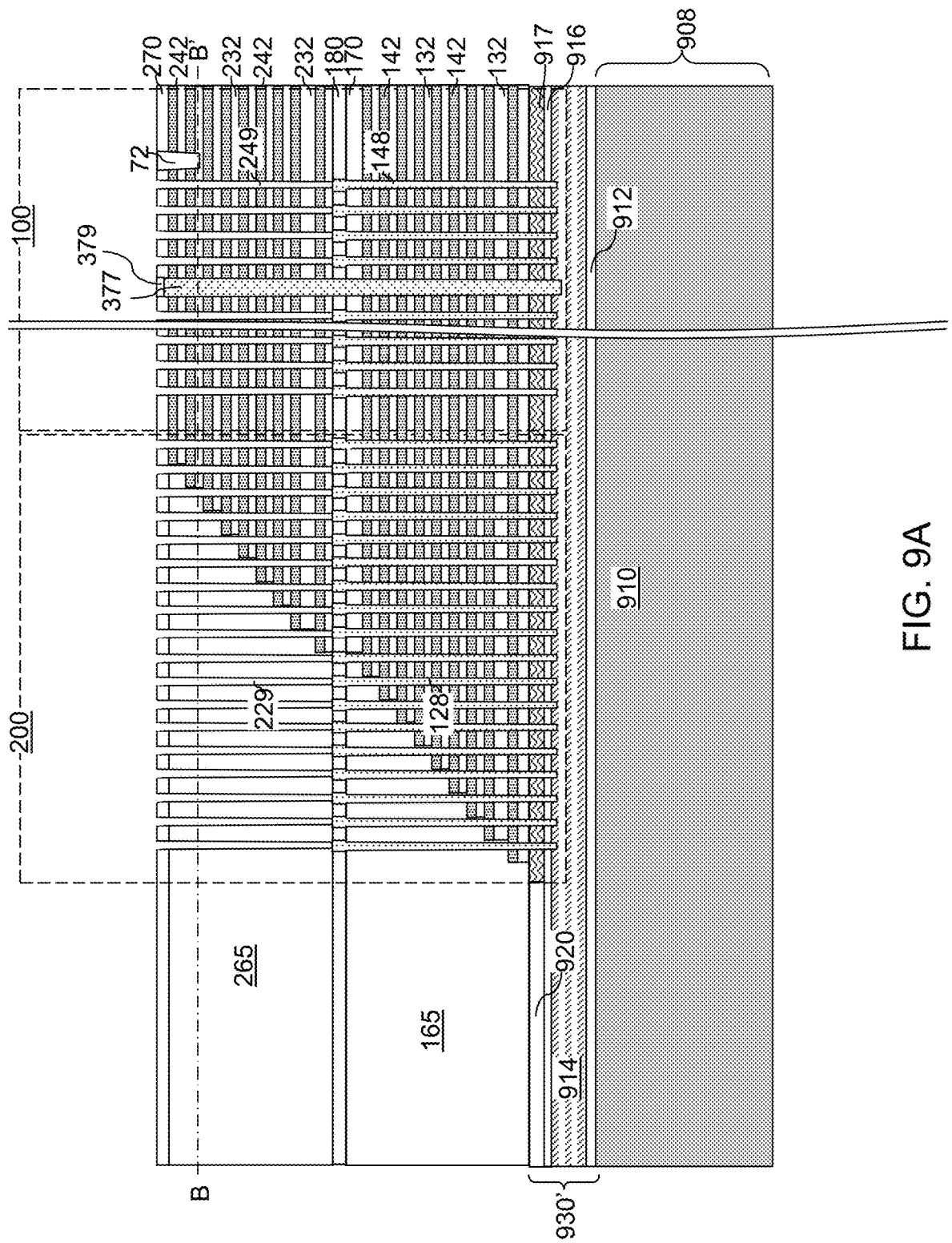
FIG. 9A is a schematic vertical cross-sectional view of the exemplary structure after formation of second-tier memory openings and second-tier support openings according to an embodiment of the present disclosure.
Figure 9B:
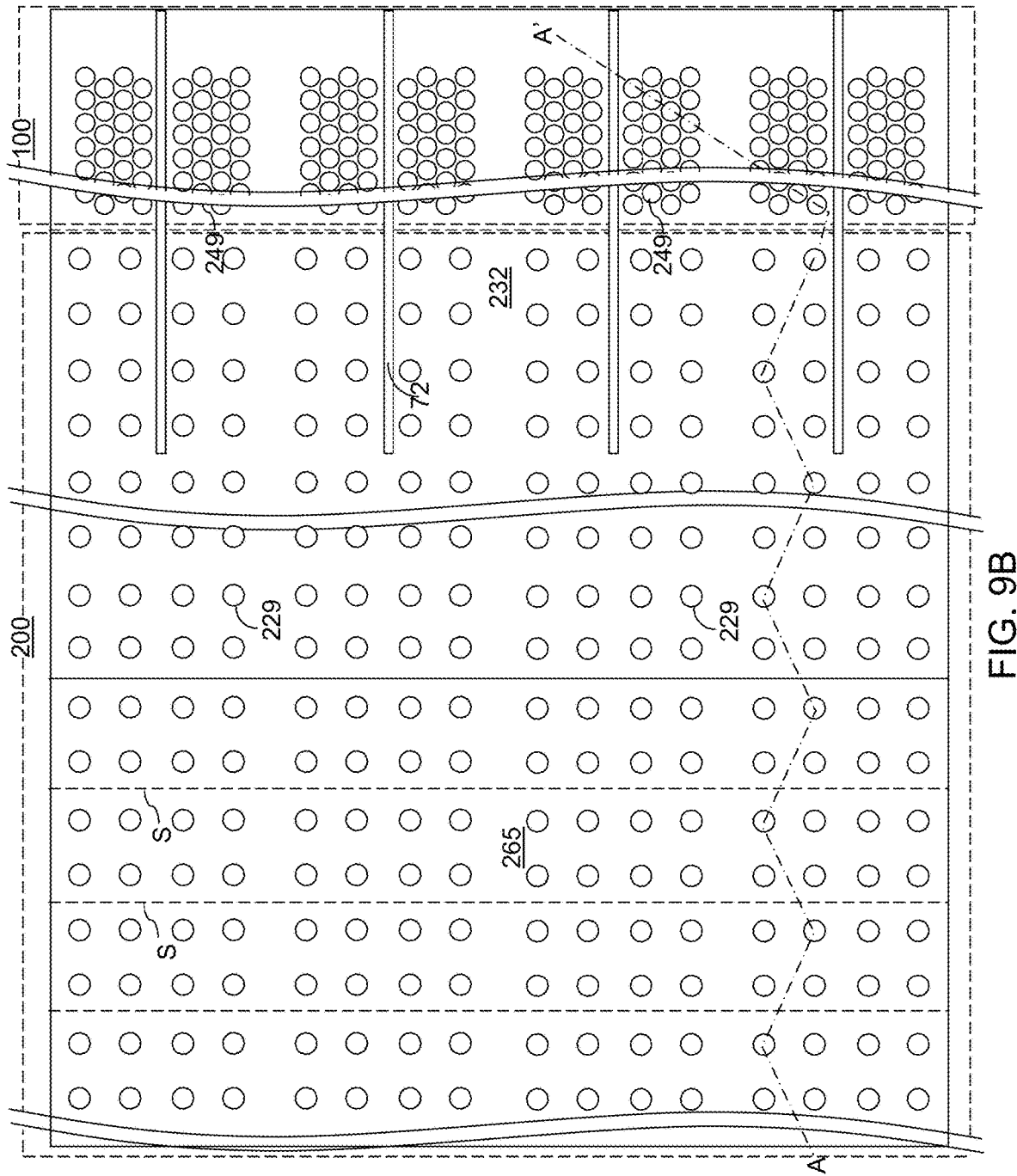
FIG. 9B is a horizontal cross-sectional of the exemplary structure along the horizontal plane B-B' of FIG. 7A. The hinged vertical plane A-A' corresponds to the plane of the schematic vertical cross-sectional view of FIG. 9A.

Referring to FIGS. 9A and 9B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 may be formed directly on a top surface of a respective one of the sacrificial first-tier memory opening fill portions 148. The second-tier support openings 229 may be formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142) and the second-tier alternating stack (232, 242) are illustrated as dotted lines in FIG. 9B.

The second anisotropic etch process may include an etch step in which the materials of the second-tier alternating stack (232, 242) may be etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 10:
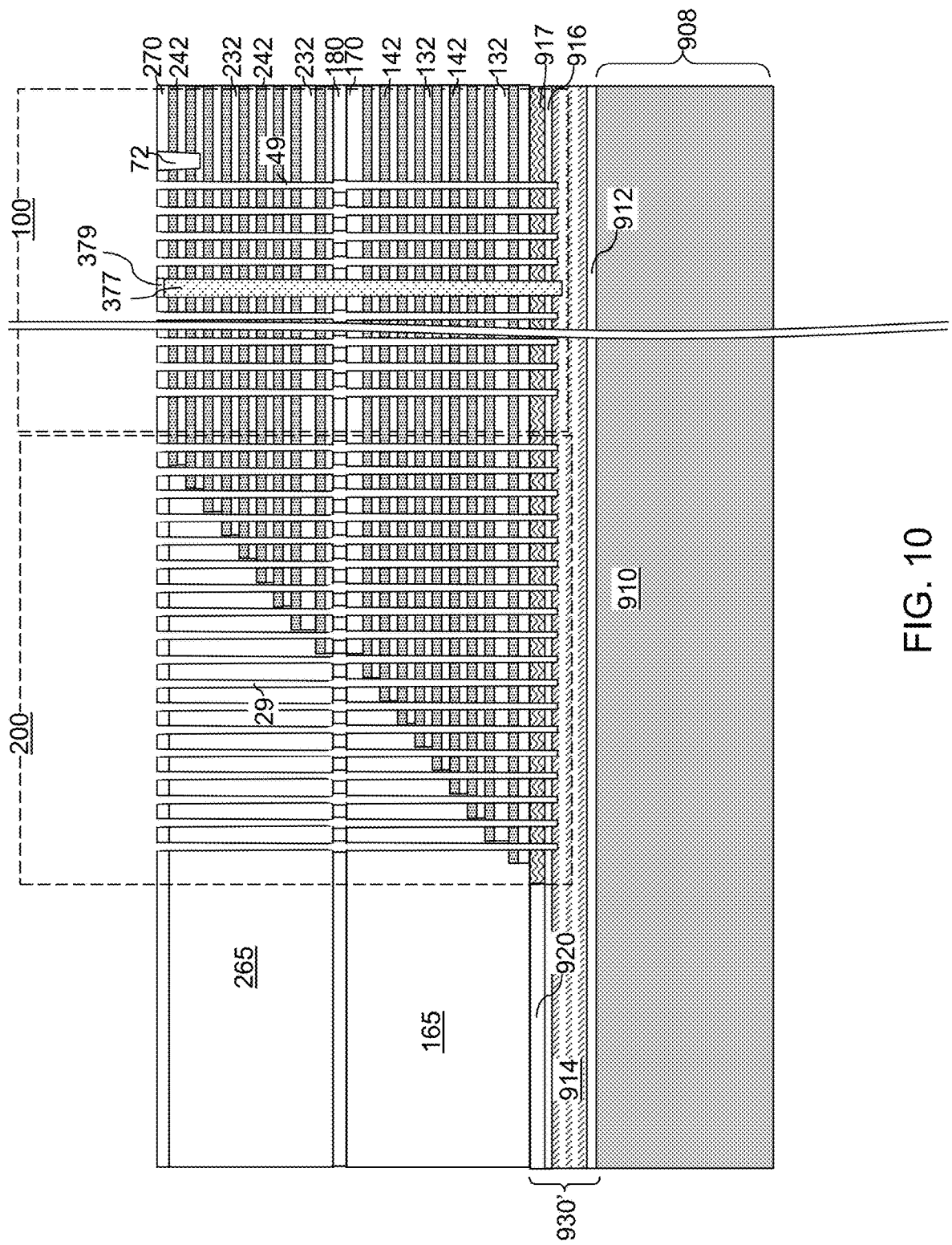
FIG. 10 is a schematic vertical cross-sectional view of the exemplary structure after formation of inter-tier memory openings and inter-tier support openings according to an embodiment of the present disclosure.
Figure 11:
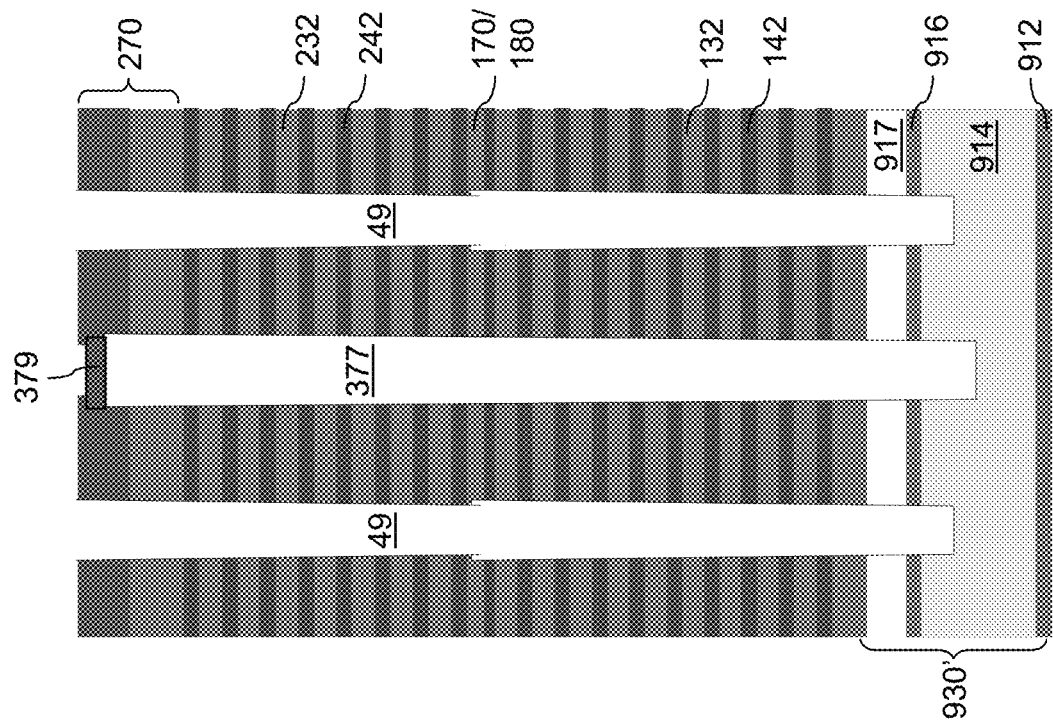
FIG. 11 is a schematic vertical cross-sectional view of a region of the exemplary structure of FIG. 10.

Referring to FIGS. 10 and 11, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, may be formed in each combination of a second-tier memory openings 249 and a volume from which a sacrificial first-tier memory opening fill portion 148 is removed. A support opening, which is also referred to as an inter-tier support opening, may be formed in each combination of a second-tier support openings 229 and a volume from which a sacrificial first-tier support opening fill portion 128 is removed.

Generally, at least one alternating stack of insulating layers (132, 232) and sacrificial material layers (142, 242) may be formed over the in-process source-level material layers 930'. Memory openings 49 may be formed through the at least one alternating stack {(132, 142), (232, 242)} and into the in-process source-level material layers 930'. The memory openings 49 extend through the source-level sacrificial layer 917 and the source-level dielectric layer 916, and into an upper portion of the semiconductor material layer 914.

Figure 12:
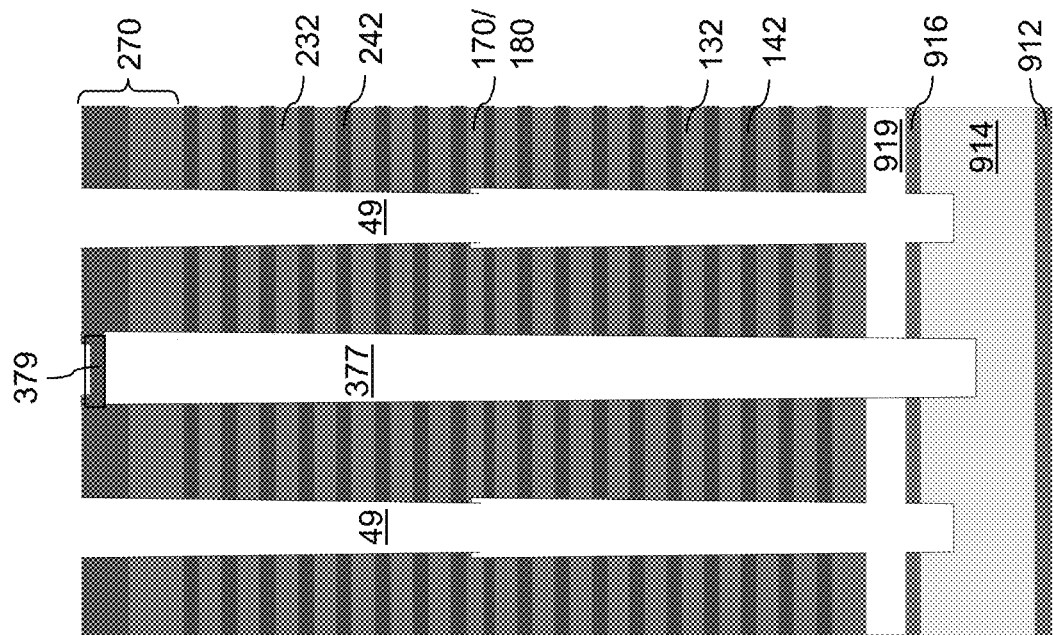
FIG. 12 is a schematic vertical cross-sectional view of a region of the exemplary structure after formation of a source cavity according to an embodiment of the present disclosure.

Referring to FIG. 12, an isotropic etch process may be performed to remove the source-level sacrificial layer 917 selective to materials of the 916, the alternating stacks {(132, 142), (232, 242)}, and the sacrificial backside trench fill structures 377 (or the material of the sacrificial liners surrounding the sacrificial backside trench fill structures 377). A source cavity 919 may be formed in volumes from which the source-level sacrificial layer 917 is removed. Sidewalls of the sacrificial backside trench fill structures 377 or outer sidewalls of the sacrificial liners (not expressly shown) that laterally surround the sacrificial backside trench fill structures 377 may be physically exposed to the source cavity 919. The memory openings 49 may extend into an upper portion of the semiconductor material layer 914, and a sidewall and a recessed horizontal surface of the semiconductor material layer 914 may be physically exposed to each memory opening 49.

Figure 13:
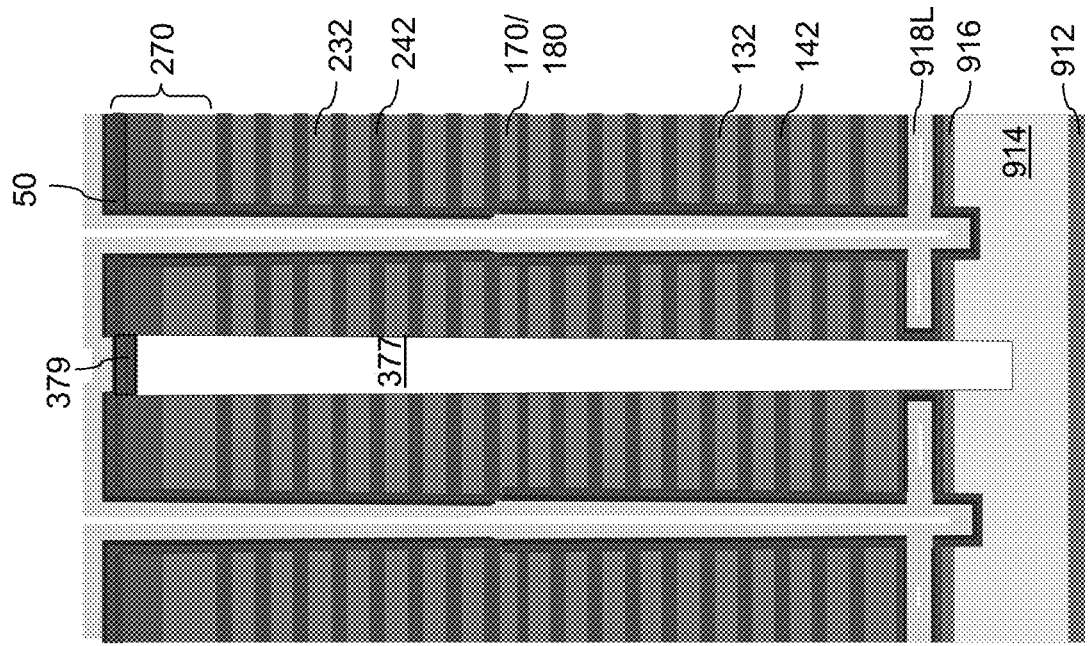
FIG. 13 is a schematic vertical cross-sectional view of a region of the exemplary structure after formation of a memory film according to an embodiment of the present disclosure.

Referring to FIG. 13, a memory film 50 may be formed by sequential conformal deposition of material layers. For example, the memory film 50 may be formed by sequentially depositing a blocking dielectric layer 52, a charge storage layer 54, and a tunneling dielectric layer 56. A sidewall portion of the memory film 50 may be formed on each sidewall of the source cavities 919. The memory film 50 may be deposited conformally on a top surface of the source cavity 919 (which may be a bottom surface of a bottommost one of the first insulating layers 132), on a bottom surface of the source cavity (which may be a top surface of the source-level dielectric layer 916, and on sidewalls of the source cavity 919 (which may include sidewalls of the sacrificial backside trench fill structures 377 or sidewalls of sacrificial liners laterally surrounding the sacrificial backside trench fill structures 377). Further, the memory films 50 may be formed directly on physically exposed sidewalls and recessed horizontal surfaces of the semiconductor material layer 914 around bottom portions of the memory openings 49.

In one embodiment, the blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

Figure 14:
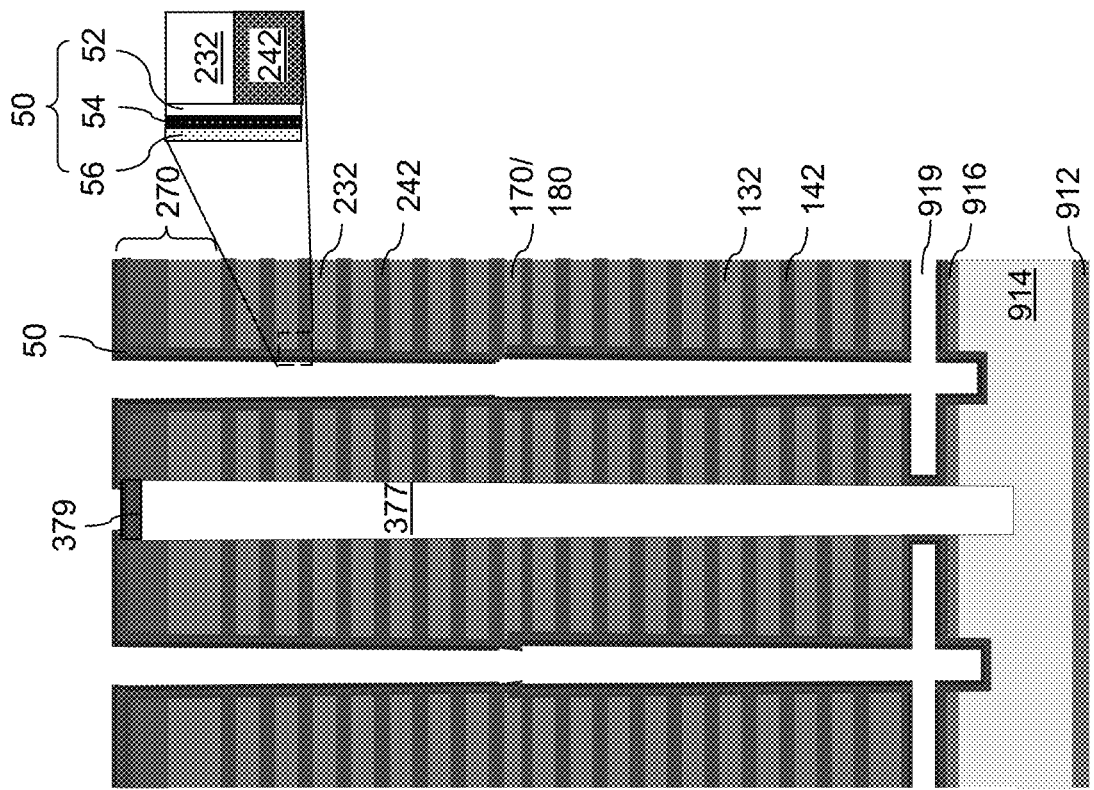
FIG. 14 is a schematic vertical cross-sectional view of a region of the exemplary structure after formation of a source contact material layer according to an embodiment of the present disclosure.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used Referring to FIG. 14, a semiconductor material having a doping of a second conductivity type may be conformally deposited in a remaining volume of the source cavity 919 and at peripheral regions of each memory opening 49 and each support opening to form a source contact material layer 918L. The second conductivity type is the opposite of the first conductivity type. For example, if the first conductivity type is p-type, the second conductivity type is n-type, and vice versa. The source cavity 919 may be filled with the source contact material layer 918L with, or without, laterally-extending seams therein. An unfilled volume, i.e., a void, that is laterally surrounded by the source contact material layer 918L may be present within each memory opening 49. In one embodiment, the source contact material layer 918L may include doped polysilicon or doped amorphous silicon that may be subsequently converted into doped polysilicon by an anneal process.

Referring to FIG. 15, an isotropic etch process may be performed to remove portions of the source contact material layer 918L located above the second insulating cap layer 270 or inside the memory openings 49. The isotropic etch process may be a wet etch process or a dry etch process. The remaining portions of the source contact material layer 918L constitute a source contact layer 918. The source contact layer 918 may be located entirely within the source cavity 919. Sidewalls of the source contact layer 918 may be laterally recessed outward relative to sidewalls of the memory openings 49 by the isotropic etch process.

An anisotropic etch process may be subsequently performed to remove horizontal portions of the memory film 50 from above the top surface of the second insulating cap layer 270. The remaining portions of the memory film 50 include a lower horizontal portion that underlies, and contacts, the source contact layer 918, an upper horizontal portion that overlies, and contacts, the source contact layer 918, and vertical portions that are located at a periphery of a respective one of the memory openings 49. The source contact layer 918 may include second conductivity type dopants at an atomic concentration in a range from $3.0 \times 10^{19}/cm^3$ to $2.0 \times 10^{21}/cm^3$, although lesser and greater dopant concentrations may also be used. The stack of layers including the spacer dielectric layer 912, the semiconductor material layer 914, the source-level dielectric layer 916, the source contact layer 918, and horizontal portions of the memory film 50 collectively constitute source-level material layers 930.

Referring to FIG. 16, an undoped semiconductor material or a doped semiconductor material having a doping of the first conductivity type may be conformally deposited directly on inner sidewalls of vertical portions of the memory film 50 and on physically exposed cylindrical sidewalls of the source contact layer 918 to form a semiconductor channel material layer. The deposited semiconductor material of the semiconductor channel material layer may be intrinsic, or may have a doping of the first conductivity type at a dopant concentration in a range from $1.0 \times 10^{14}/cm^3$ to $3.0 \times 10^{18}/cm^3$, although lesser and greater dopant concentrations may also be used.

A dielectric material such as undoped silicate glass or a doped silicate glass may be conformally deposited within unfilled volumes of the memory openings 49. Portions of the deposited dielectric material may be vertically recessed such that the recessed surfaces of the deposited dielectric material are formed between the horizontal plane including the bottom surface of the second insulating cap layer 270 and a horizontal plane including the top surface of the second insulating cap layer 270. Each remaining portion of the dielectric material constitutes a dielectric core 62.

Portions of the semiconductor channel material layer located above the top surfaces of the dielectric cores 62 may be removed by an isotropic etch process. Each remaining vertical portion of the semiconductor channel material layer constitutes a vertical semiconductor channel 60. Each vertical semiconductor channel may vertically extend through each of the sacrificial material layers (142, 242). In one embodiment, each vertical semiconductor channel 60 may contact the source contact layer 918 to form a respective cylindrical p-n junction.

A doped semiconductor material having a doping of the second conductivity type may be deposited in upper portions of the memory openings 49 directly on top surfaces of the vertical semiconductor channels 60. Excess portions of the doped semiconductor material may be removed from above the horizontal plane including the topmost surface of the second insulating cap layer 270 by a planarization process. The planarization process may use a recess etch process or a chemical mechanical planarization process. Each remaining portion of the doped semiconductor material in upper regions of the memory openings 49 constitutes a drain region 63.

Each set of a cylindrical vertical portion of the memory film 50 and a vertical semiconductor channel 60 within a memory opening 49 constitutes a memory stack structure 55. Each combination of material portions that fill a memory opening 49 constitutes a memory opening fill structure 58. In one embodiment, a memory opening fill structure 58 may include a cylindrical vertical portion of a memory film 50, a vertical semiconductor channel 60, a dielectric core 62, and a drain region 63.

Figures 17, 18:
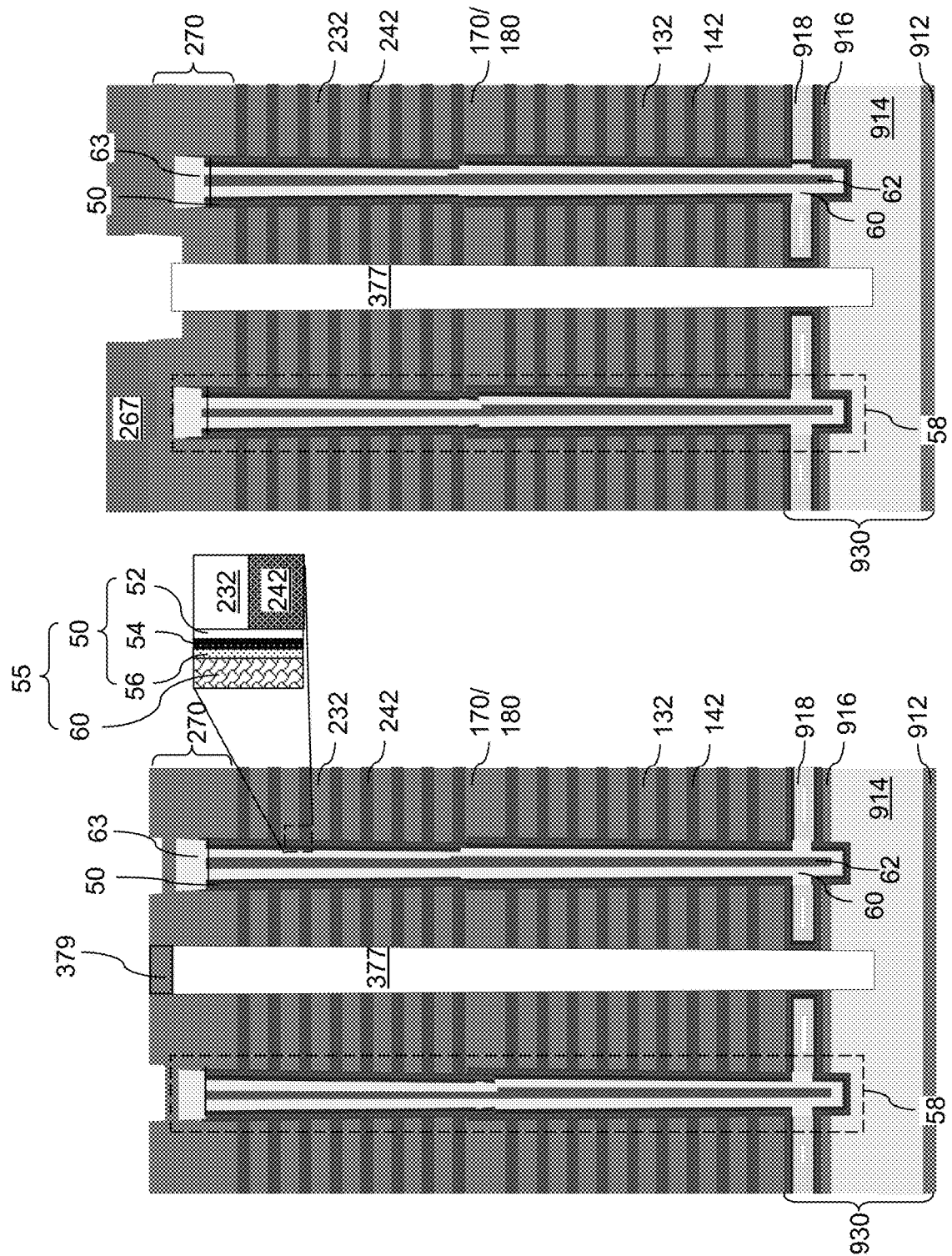
FIG. 17 is a schematic vertical cross-sectional view of a region of the exemplary structure after deposition of a dielectric material layer according to an embodiment of the present disclosure.
FIG. 18 is a schematic vertical cross-sectional view of a region of the exemplary structure after application and patterning of a photoresist layer and physical exposure of sacrificial backside trench fill structures according to an embodiment of the present disclosure.

Referring to FIG. 17, a dielectric material may be optionally deposited over the top surfaces of the drain regions 63. The dielectric material may include the same material as the material of the second insulating cap layer 270, and may be incorporated into the second insulating cap layer 270.

Referring to FIG. 18, a photoresist layer 267 may be applied over the exemplary structure, and may be lithographically patterned to form line-shaped openings within areas that include the areas of the 377. An anisotropic etch process may be performed to remove underlying portions of the second insulating cap layer 270 and the dielectric cap structures 379. Top surfaces of the sacrificial backside trench fill structures 377 may be physically exposed. The photoresist layer 267 may be subsequently removed, for example, by ashing.

Figure 19:
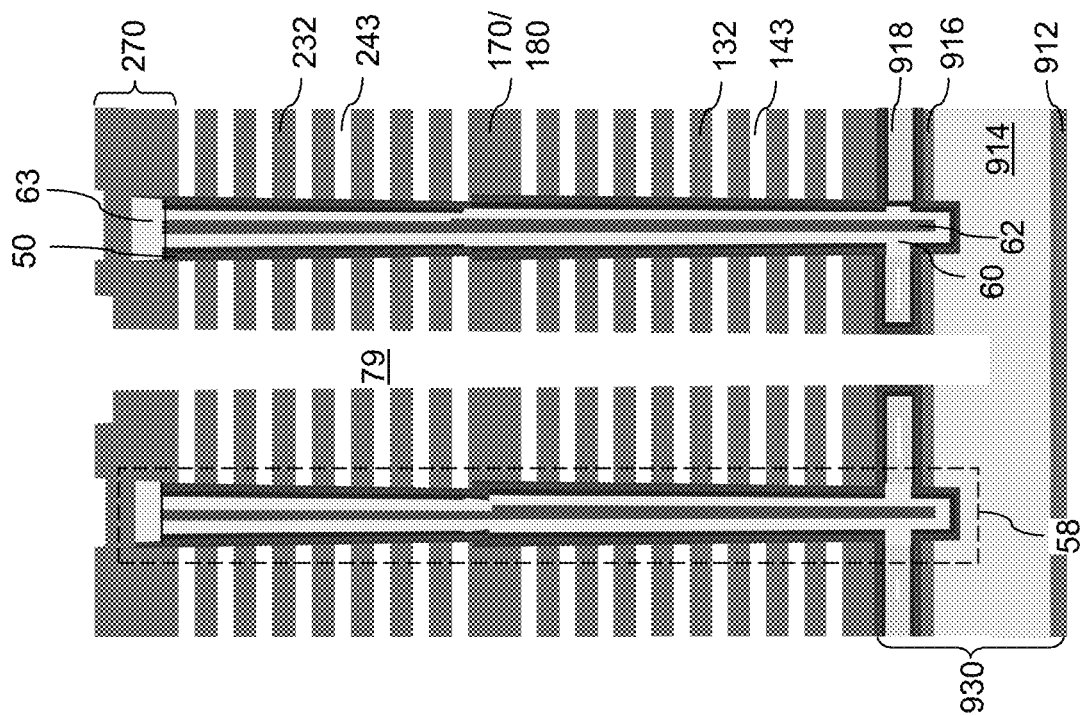
FIG. 19 is a schematic vertical cross-sectional view of a region of the exemplary structure after removal of the sacrificial backside trench fill structures according to an embodiment of the present disclosure.

Referring to FIG. 19, the sacrificial backside trench fill structures 377 and sacrificial liners that laterally surround the sacrificial backside trench fill structures, if present, may be removed selective to the materials of the alternating stacks {(132, 142), (232, 242)}, the memory film 50, and the semiconductor material layer 914. An isotropic etch process or an anisotropic etch process may be used. In one embodiment, the sacrificial backside trench fill structures 377 may include cavities therein, and removal of the sacrificial backside trench fill structures 377 may be facilitated by the cavities. A void may be formed within each volume of the backside trenches 79.

In the alternative embodiment, the backside trenches 79 may be formed after the step shown in FIG. 16. In this alternative embodiment, the steps shown in FIGS. 17, 18 and 19 and described above may be omitted. In this alternative embodiment, if there layer 918 has a seam exposed in the backside trench 79, then an optional sacrificial conformal amorphous silicon or polysilicon layer may be formed on the sidewalls of the backside trench 79 and filling the seam in layer 918. The sacrificial conformal amorphous silicon or polysilicon layer may be removed by anisotropic etching from the sidewalls of the backside trench 79, while it remains as filler in the seam in layer 918.

Figure 20:
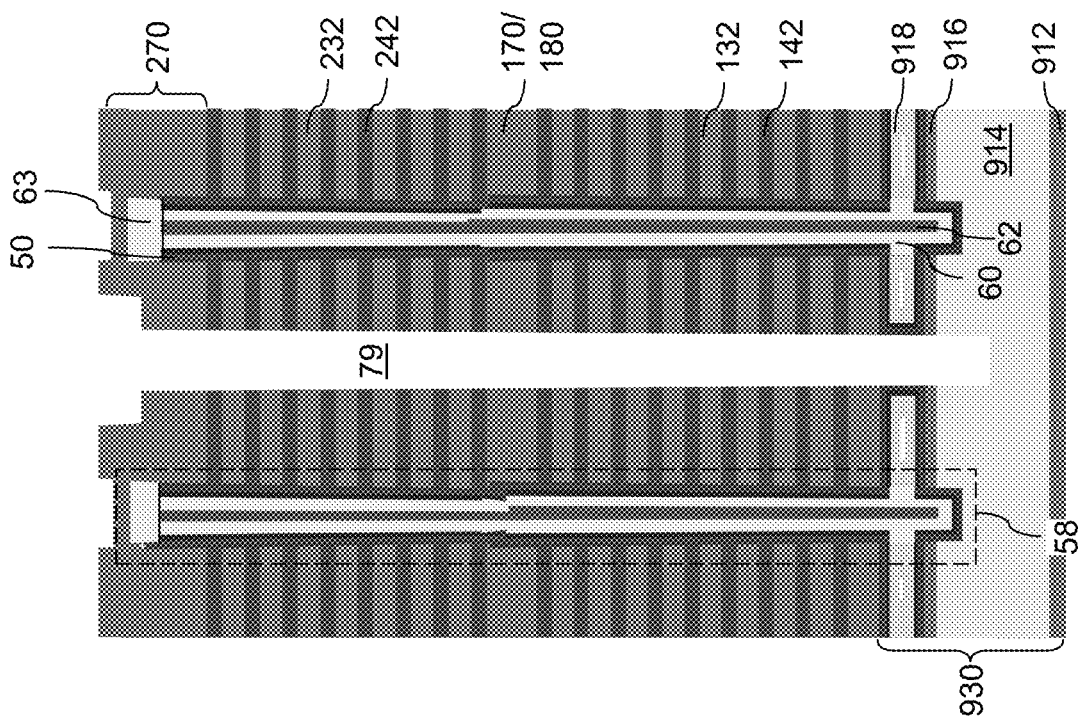
FIG. 20 is a schematic vertical cross-sectional view of a region of the exemplary structure after formation of backside recesses according to an embodiment of the present disclosure.

Referring to FIG. 20, the sacrificial material layers (142, 242) may be removed selective to the insulating layers (132, 232), the first and second insulating cap layers (170, 270), and the semiconductor material layer 914. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) may be formed in volumes from which the sacrificial material layers (142, 242) are removed. The backside recesses (143, 243) may include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the semiconductor substrate layer 910. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 21:
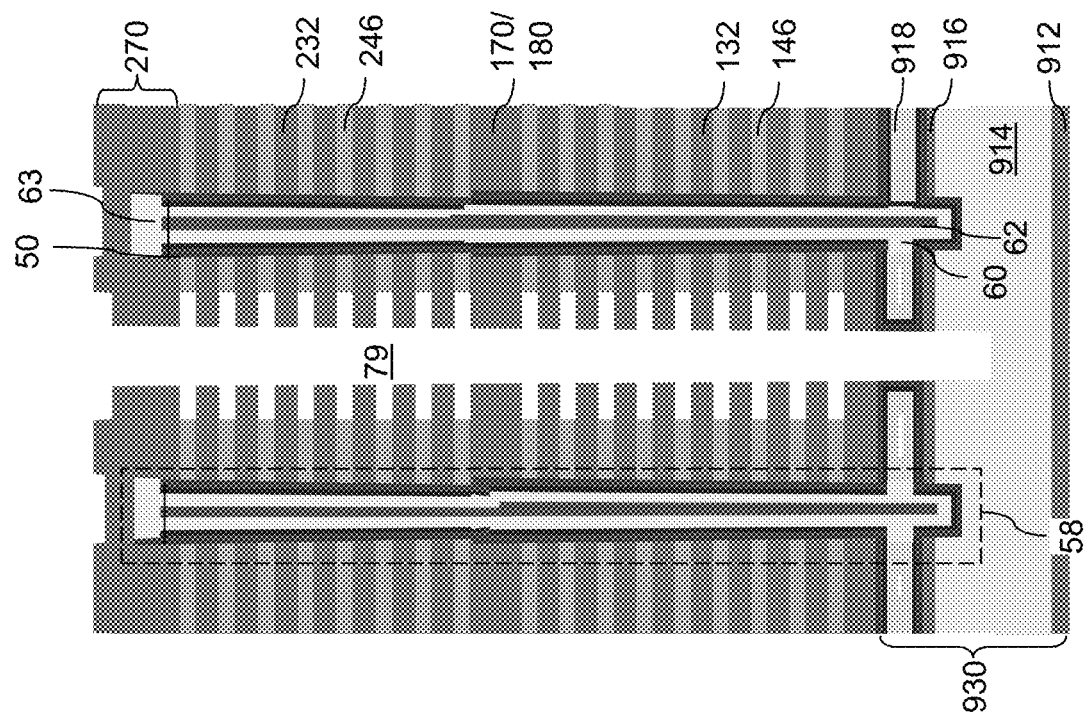
FIG. 21 is a schematic vertical cross-sectional view of a region of the exemplary structure after formation of electrically conductive layers according to an embodiment of the present disclosure.

Referring to FIG. 21, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A continuous metallic material layer 46L may be present at peripheral regions of the backside trenches 79 and over the second insulating cap layer 270. A backside cavity is present in the portion of each backside trench 79 that is not filled with the continuous metallic material layer.

Figure 22:
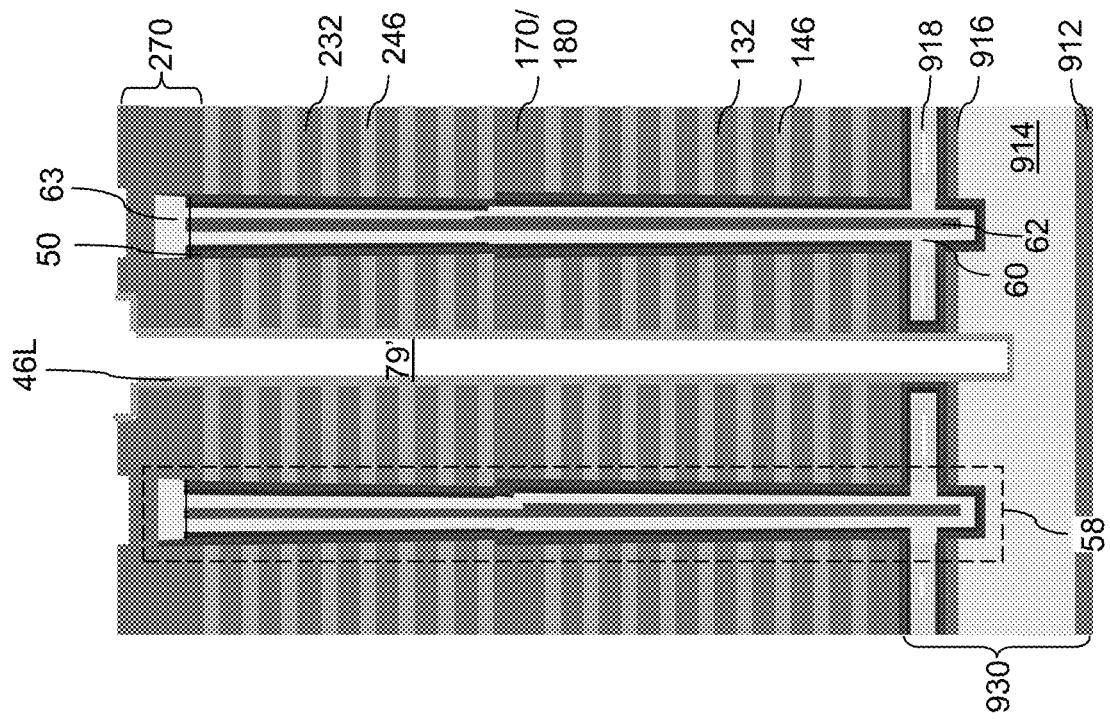
FIG. 22 is a schematic vertical cross-sectional view of a region of the exemplary structure after lateral recessing of the electrically conductive layers according to an embodiment of the present disclosure.
Figure 26A:
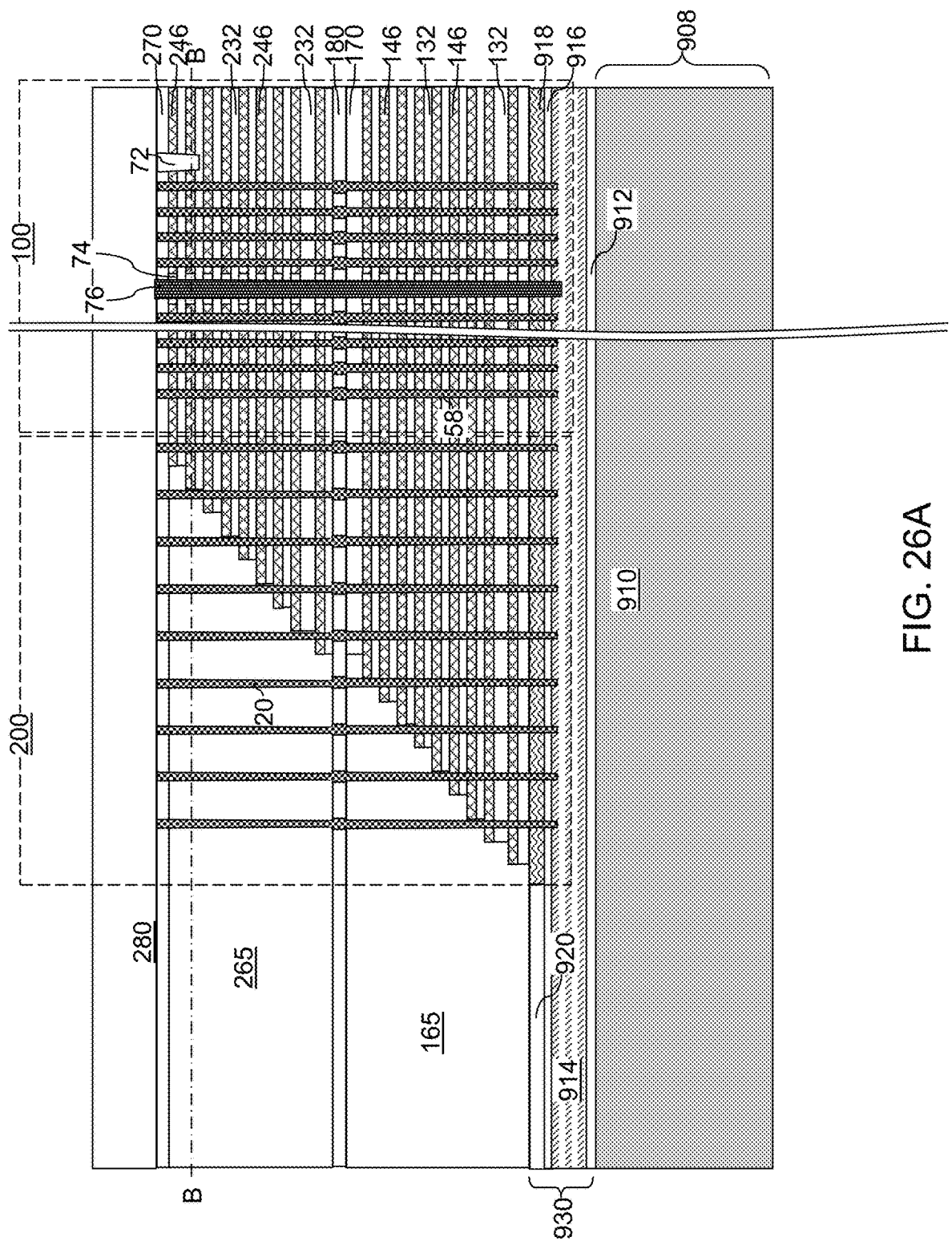
FIG. 26A is a schematic vertical cross-sectional view of the exemplary structure at the processing steps of FIG. 25.
Figure 26B:
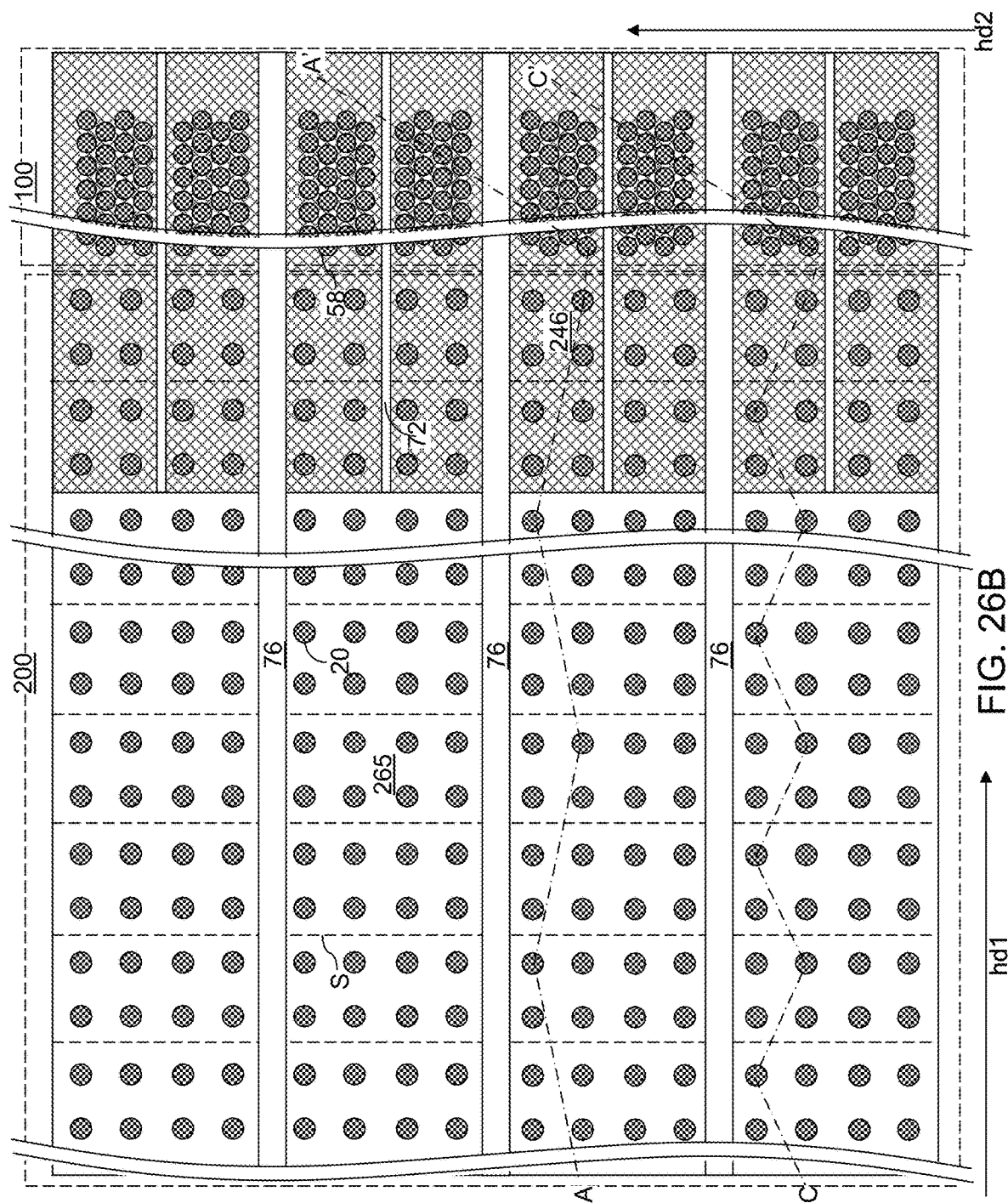
FIG. 26B is a horizontal cross-sectional of the exemplary structure along the horizontal plane B-B' of FIG. 26A. The hinged vertical plane A-A' corresponds to the plane of the schematic vertical cross-sectional view of FIG. 26A.
Figure 26C:
FIG. 26C is a schematic vertical cross-sectional view of the exemplary structure along the vertical plane C-C' of FIG. 26B.

Referring to FIG. 22, the continuous metallic material layer 46L may be removed from inside the backside trenches 79. Specifically, the deposited metallic material of the continuous metallic material layer 46L may be etched back from the sidewalls of each backside trench 79 and from above the second insulating cap layer 270, for example, by an anisotropic or isotropic etch. Peripheral portions of the electrically conductive layers (146, 246) may be laterally recessed around each backside trench 79 by a lateral recess distance, which may be in a range from 10 nm to 100 nm, although lesser and greater lateral recesses distances may also be used. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Referring to FIG. 23, a conformal insulating material layer 74L may be deposited at peripheral portions of the backside trenches 79, on physically exposed sidewalls of the electrically conductive layers (146, 246), and on physically exposed sidewalls of the memory film 50 (which may be physically exposed sidewalls of the blocking dielectric layer 52). The conformal insulating material layer 74L may include a dielectric material such as undoped silicate glass or a doped silicate glass. A backside cavity may be present within each unfilled volume of the backside trenches 79.

Referring to FIG. 24, an isotropic etch process may be performed to remove portions of the conformal insulating material layer 74L that are located above the second insulating cap layer 270 or at peripheral portions of the backside trenches 79. Remaining portions of the conformal insulating material layer 74L constitute insulating rails 74 that laterally extend along a respective horizontal direction. In one embodiment, the insulating rails 74 may laterally extend along the first horizontal direction hd1. Each of the insulating rails 74 may laterally contact a respective one of the electrically conductive layers (146, 246), and may have the same height as the respective one of the electrically conductive layers (146, 246).

Referring to FIGS. 25 and 26A-26C, physically exposed sidewall portions of the memory film 50 may be removed using at least one etch process. For example, a series of isotropic etch processes may be performed to sequentially etch sidewall portions of the blocking dielectric layer 52, the charge storage layer 54, and the tunneling dielectric layer 56 that are proximal to the backside trenches 79. Sidewall of the source contact layer 918 may be physically exposed upon removal of the sidewall portion of the memory film 50.

At least one conductive material may be sequentially deposited in the backside trenches 79. For example, a heavily doped semiconductor material (such as doped polysilicon) having a doping of the second conductivity type may be deposited at a bottom portion of each backside trench 79 and at peripheral regions of an upper portion of each backside trench 79. A center region of each backside trench 79 may be optionally recessed by an isotropic etch or an anisotropic etch, and a metallic nitride material such as TiN, TaN, or WN may be deposited. A metallic fill material such as W, Cu, Mo, Ru, or Co may be deposited in remaining volumes of the backside trenches 79. Excess portions of the metallic fill material, the metallic nitride material, and the heavily doped semiconductor material may be removed from above the horizontal plane including the top surface of the second insulating cap layer 270 by a planarization process, which may use a recess etch process and/or a chemical mechanical planarization process. Each remaining combination of the metallic fill material, the metallic nitride material, and the heavily doped semiconductor material constitutes a backside contact via structure 76. For example, each backside contact via structure 76 may include a doped semiconductor contact via portion 76A that includes a remaining portion of the doped semiconductor material, a metallic liner contact via portion 76B that includes a remaining portion of the metallic nitride material, and a metallic fill material contact via portion 76C that includes a remaining portion of the metallic fill material.

A contact-level dielectric layer 280 may be formed over the second insulating cap layer 270. The contact-level dielectric layer 280 includes a dielectric material such as silicon oxide, and may have a thickness in a range from 100 nm to 600 nm, although lesser and greater thicknesses may also be used.

In one embodiment, the memory film 50 comprises a layer stack including a blocking dielectric layer 52, a charge storage layer 54, and a tunneling dielectric layer 56. In one embodiment, portions of the tunneling dielectric layer 56 located within the lower horizontal portion 50L of the memory film 50 and portions of the tunneling dielectric layer 50 located within the upper horizontal portion 50U of the memory film 50 contact horizontal surfaces of the source contact layer 918. In one embodiment, portions of the tunneling dielectric layer 56 located within the vertical portions of the memory film 50 contact the vertical semiconductor channels 60.

Figure 27A:
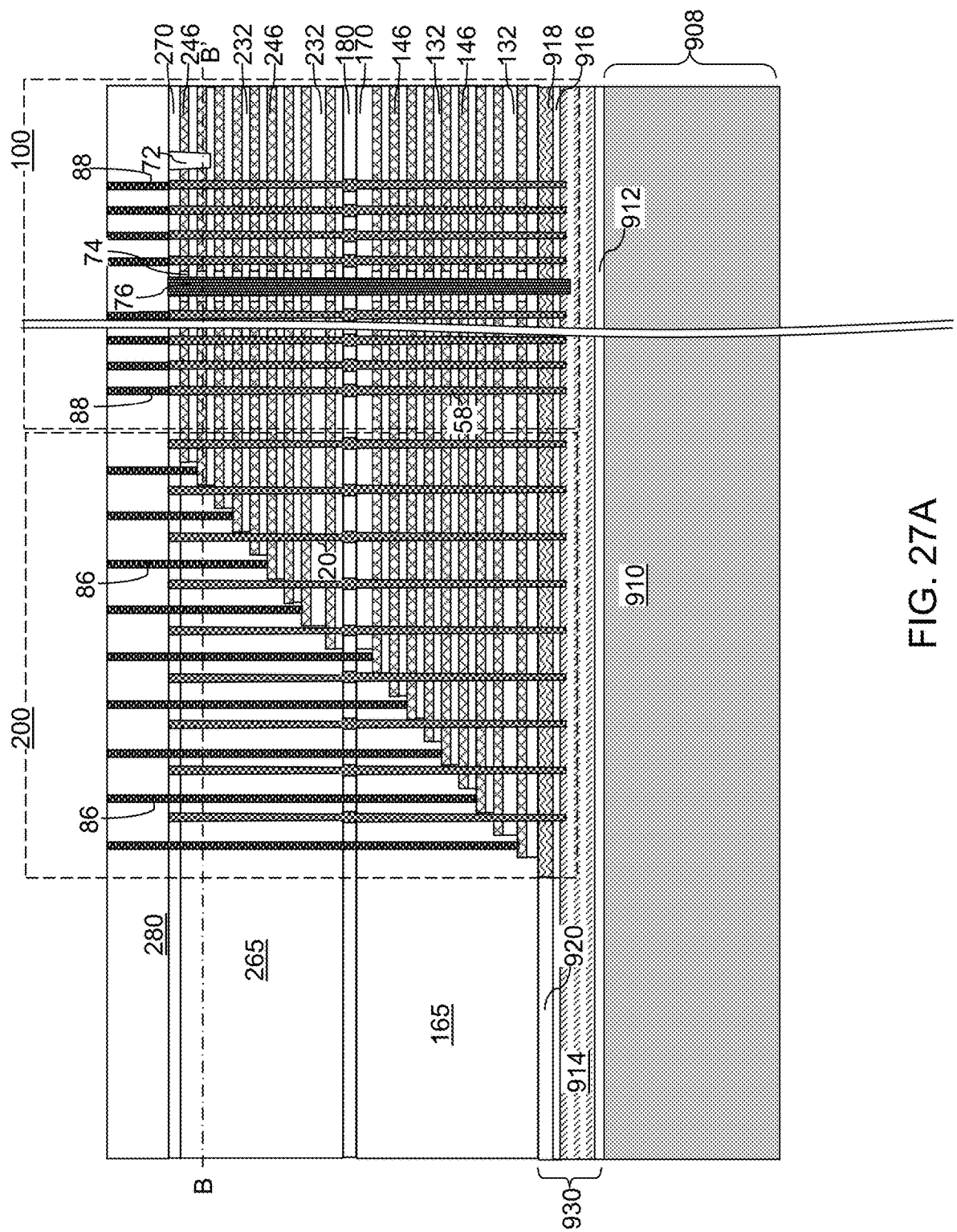
FIG. 27A is a schematic vertical cross-sectional view of the exemplary structure after formation of various contact via structures according to an embodiment of the present disclosure.
Figure 27B:
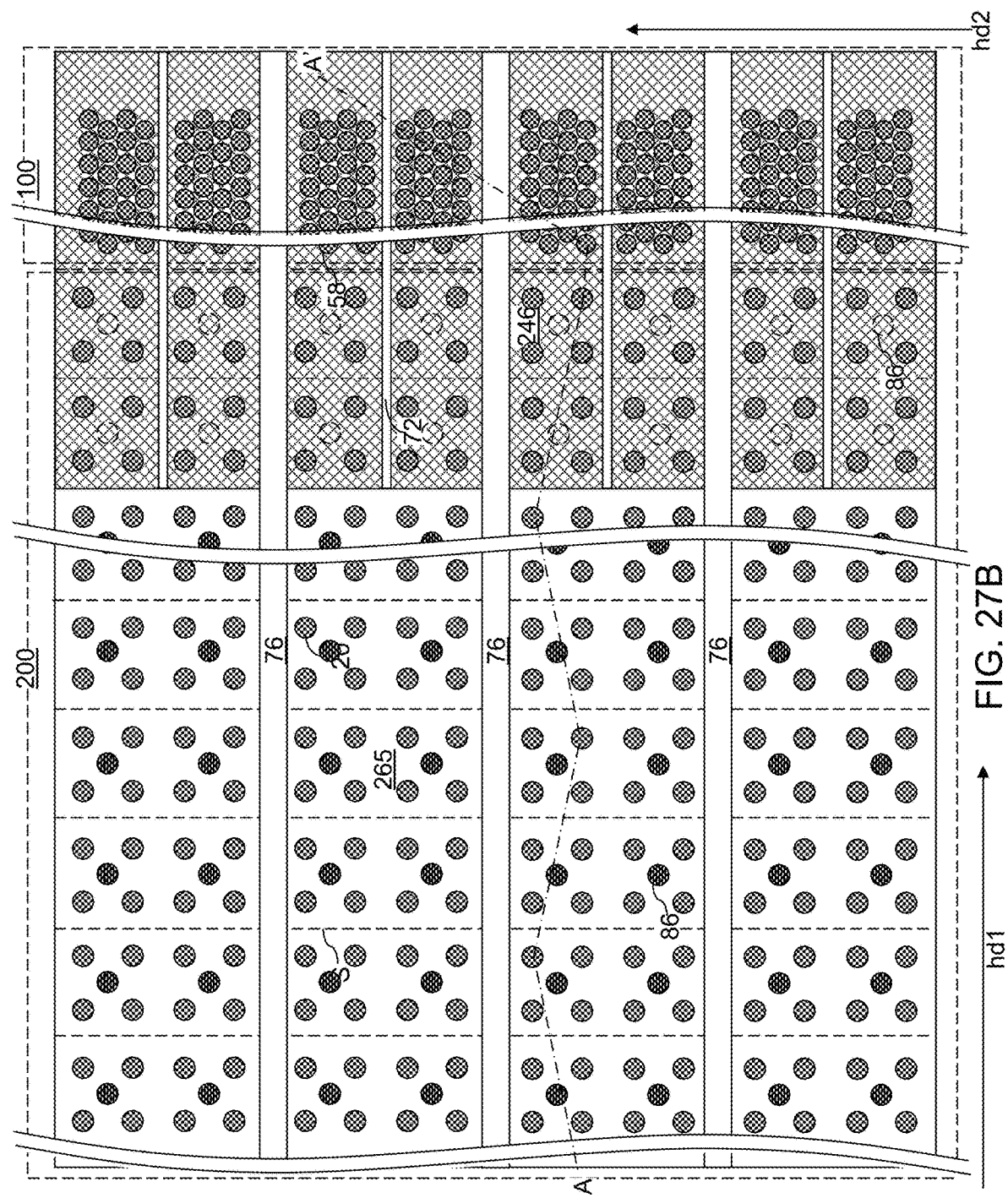
FIG. 27B is a horizontal cross-sectional view of the exemplary structure along the vertical plane B-B' of FIG. 27A. The hinged vertical plane A-A' corresponds to the plane of the schematic vertical cross-sectional view of FIG. 27A.

Referring to FIGS. 27A and 27B, a photoresist layer (not shown) may be applied over the contact-level dielectric layer 280, and may be lithographically patterned to form various contact via openings. For example, openings for forming drain contact via structures 88 may be formed in the memory array region 100, and openings for forming staircase region contact via structures 86 may be formed in the staircase region 200. An anisotropic etch process is performed to transfer the pattern in the photoresist layer through the second and first contact-level dielectric layers (280, 290) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second stepped dielectric material portions (165, 265). The photoresist layer may be subsequently removed, for example, by ashing.

Drain contact via structures 88 may be formed in the drain contact via cavities and on a top surface of a respective one of the drain regions 63. Staircase-region contact via structures 86 may be formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 28:
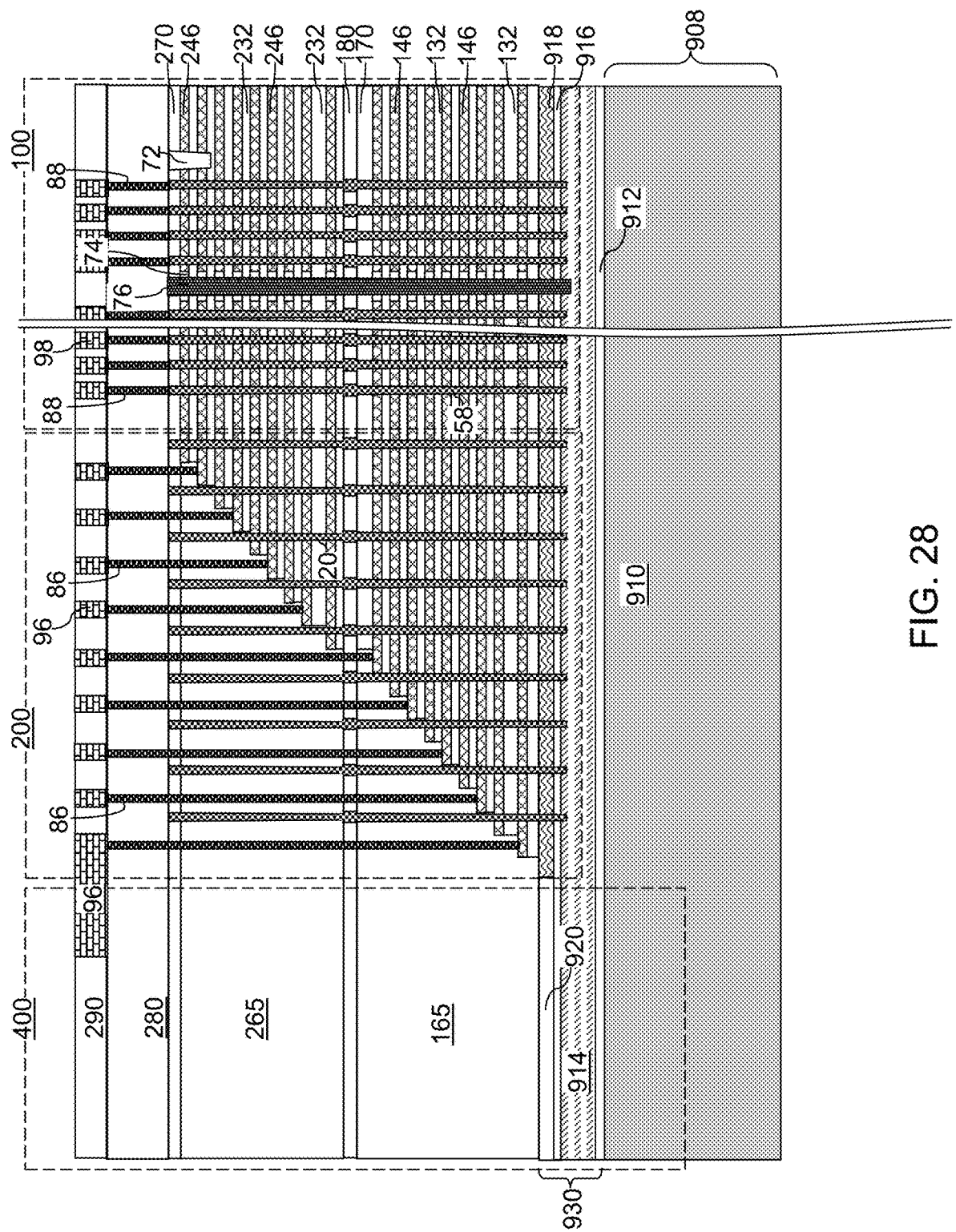
FIG. 28 is a schematic vertical cross-sectional view of the exemplary structure after formation of metal line structures according to an embodiment of the present disclosure.

Referring to FIG. 28, at least one additional dielectric layer may be formed over the contact-level dielectric layer 280, and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layer 280. The upper-level metal interconnect structures may include bit lines 98 contacting a respective one of the drain contact via structures 88, and interconnection line structures 96 contacting, and/or electrically connected to, at least one of the staircase-region contact via structures 86 and/or the through-memory-level via structures 88.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 908 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 908, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 908, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Referring to all drawings and according to various embodiments of the present disclosure, a three-dimensional memory device is provided, which comprises: an alternating stack of insulating layers (132, 232) and electrically conductive layers (146, 246) located over a substrate 908; source-level material layers 930 located between the substrate 908 and the alternating stack {(132, 146), (232, 246)}, wherein the source-level material layers 930 comprise a source contact layer 918 comprising a doped semiconductor material, a lower horizontal portion of a memory film 50 underlying the source contact layer 918, and an upper horizontal portion of the memory film 50 overlying the source contact layer 918; memory openings 49 vertically extending through the alternating stack {(132, 146), (232, 246)} and extending into the source-level material layers 930; memory opening fill structures 58 located in the memory openings 49, wherein each of the memory opening fill structures 58 comprises a respective vertical portion of the memory film 50 and a respective vertical semiconductor channel 60 that contacts the source contact layer 918; and a backside contact via structure 76 contacting a sidewall of the source contact layer 918.

In one embodiment, the backside contact via structure 76 contacts a sidewall of a horizontal portion of the tunneling dielectric layer 56 in the lower horizontal portion of the memory film 50, and contacts a sidewall of a horizontal portion of the tunneling dielectric layer 56 in the upper horizontal portion of the memory film 50. In one embodiment, the backside contact via structure 76 contacts a sidewall of a horizontal portion of the charge storage layer 54 in the lower horizontal portion of the memory film 50, and contacts a sidewall of a horizontal portion of the charge storage layer 54 in the upper horizontal portion of the memory film 50.

In one embodiment, the source-level material layers 930 comprise a semiconductor material layer 914 that is vertically spaced from the source contact layer 918 by a source-level dielectric layer 916, and is electrically connected to the source contact layer 918 by the backside contact via structure 76. In one embodiment, each of the memory opening fill structures 58 comprises a respective downward-protruding portion of the memory film 50 that protrudes through a respective opening through the source-level dielectric layer 916 and contacts a respective recessed surface of the semiconductor material layer 914. In one embodiment, each of the downward-protruding portions of the memory film 50 is adjoined to the lower horizontal portion 50L of the memory film 50. In one embodiment, a bottom surface of the lower horizontal portion 50L of the memory film 50 contacts a top surface of the source-level dielectric layer 918.

In one embodiment, a vertical semiconductor channel 60 selected from the vertical semiconductor channels 60 contacts the source contact layer 918 at a cylindrical interface that is laterally offset outward from a sidewall of one of the memory openings 49 that includes the vertical semiconductor channel 60 by a uniform lateral offset distance. In one embodiment, the vertical semiconductor channels 60 have a doping of a first conductivity type; and the source contact layer 918 has a doping of a second conductivity type that is an opposite of the first conductivity type.

Embodiments of the present disclosure use memory openings 49 as a conduit for an etchant that etches the material of the source-level sacrificial layer 917, and as a conduit for a reactant for depositing the material of the source contact layer 918. The backside trenches 79 may be used to form sacrificial backside trench fill structures 377, which are used as structures that mechanically support an alternating stack of insulating layers (132, 232) and sacrificial material layers (142, 242) during replacement of the source-level sacrificial layer 917 with the source contact layer 918. The sacrificial backside trench fill structures 377 are subsequently replaced with backside contact via structures 76 to provide electrical contact to the source contact layer 918.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   source-level material layers located between the substrate and the alternating stack, wherein the source-level material layers comprise a source contact layer comprising a doped semiconductor material, a lower horizontal portion of a memory film underlying the source contact layer, and an upper horizontal portion of the memory film overlying the source contact layer;
   memory openings vertically extending through the alternating stack and extending into the source-level material layers;
   memory opening fill structures located in the memory openings, wherein each of the memory opening fill structures comprises a respective vertical portion of the memory film and a respective vertical semiconductor channel that contacts the source contact layer; and
   a backside contact via structure contacting a sidewall of the source contact layer;
   wherein a vertical semiconductor channel selected from the vertical semiconductor channels contacts the source contact layer at a cylindrical interface that is laterally offset outward from a sidewall of one of the memory openings that includes the vertical semiconductor channel by a uniform lateral offset distance.

2. The three-dimensional memory device of claim 1, wherein the memory film comprises a layer stack including a blocking dielectric layer, a charge storage layer, and a tunneling dielectric layer.

3. The three-dimensional memory device of claim 2, wherein portions of the tunneling dielectric layer located within the lower horizontal portion of the memory film and portions of the tunneling dielectric layer located within the upper horizontal portion of the memory film contact horizontal surfaces of the source contact layer.

4. The three-dimensional memory device of claim 3, wherein portions of the tunneling dielectric layer located within the vertical portions of the memory film contact the vertical semiconductor channels.

5. The three-dimensional memory device of claim 2, wherein the backside contact via structure contacts a sidewall of a horizontal portion of the tunneling dielectric layer in the lower horizontal portion of the memory film, and contacts a sidewall of a horizontal portion of the tunneling dielectric layer in the upper horizontal portion of the memory film.

6. The three-dimensional memory device of claim 5, wherein the backside contact via structure contacts a sidewall of a horizontal portion of the charge storage layer in the lower horizontal portion of the memory film, and contacts a sidewall of a horizontal portion of the charge storage layer in the upper horizontal portion of the memory film.

7. The three-dimensional memory device of claim 1, wherein the source-level material layers comprise a semiconductor material layer that is vertically spaced from the source contact layer by a source-level dielectric layer, and is electrically connected to the source contact layer by the backside contact via structure.

8. The three-dimensional memory device of claim 7, wherein each of the memory opening fill structures comprises a respective downward-protruding portion of the memory film that protrudes through a respective opening through the source-level dielectric layer and contacts a respective recessed surface of the semiconductor material layer.

9. The three-dimensional memory device of claim 1, wherein:
   the vertical semiconductor channels have a doping of a first conductivity type; and
   the source contact layer has a doping of a second conductivity type that is an opposite of the first conductivity type.

10. A method of forming a three-dimensional memory device, comprising:
   forming in-process source-level material layers over a substrate, wherein the in-process source-level material layers comprise a source-level sacrificial layer;
   forming an alternating stack of insulating layers and sacrificial material layers over the in-process source-level material layers;
   forming memory openings through the alternating stack and into the in-process source-level material layers;
   forming a source cavity by removing the source-level sacrificial layer;
   forming a memory film and a source contact layer in the source cavity and in the memory openings, wherein horizontal portions of the memory film and the source contact layer are formed in the source cavity and vertical portions of the memory film are formed in the memory openings;

forming vertical semiconductor channels and drain regions in remaining volumes of the memory openings; and forming a backside contact via structure directly on a sidewall of the source contact layer;

wherein:

forming the in-process source-level material layers comprises sequentially forming a semiconductor material layer, a source-level dielectric layer, and the source-level sacrificial layer; and the memory openings extend through the source-level sacrificial layer and the source-level dielectric layer, and into an upper portion of the semiconductor material layer.

11. The method of claim 10, wherein the memory film is formed by sequentially depositing a blocking dielectric layer, a charge storage layer, and a tunneling dielectric layer.

12. The method of claim 10, wherein:

a sidewall portion of the memory film is formed on sidewalls of the source cavities; and the method comprises removing the sidewall portion of the memory film, wherein the sidewall of the source contact layer is physically exposed upon removal of the sidewall portion of the memory film.

13. The method of claim 10, wherein the memory film is deposited conformally on a top surface of the source cavity, on a bottom surface of the source cavity, and on sidewalls of the source cavity.

14. The method of claim 10, wherein the memory film is formed directly on recessed surfaces of the semiconductor material layer around the memory openings.

15. The method of claim 10, further comprising:

forming a backside trench through the alternating stack;

removing a sidewall portion of the memory film around the backside trench, wherein the sidewall of the source contact layer sidewall is physically exposed; and forming the backside contact via structure in the backside trench.

16. The method of claim 15, further comprising:

forming a sacrificial backside trench fill structure in the backside trench prior to forming the memory film; and forming a void within a volume of the backside trench after formation of the drain regions, wherein the sidewall portion of the memory film is removed around the backside trench after forming the void within the volume of the backside trench.

17. A three-dimensional memory device comprising:

an alternating stack of insulating layers and electrically conductive layers located over a substrate;

source-level material layers located between the substrate and the alternating stack, wherein the source-level material layers comprise a source contact layer comprising a doped semiconductor material, a lower horizontal portion of a memory film underlying the source contact layer, and an upper horizontal portion of the memory film overlying the source contact layer;

memory openings vertically extending through the alternating stack and extending into the source-level material layers;

memory opening fill structures located in the memory openings, wherein each of the memory opening fill structures comprises a respective vertical portion of the memory film and a respective vertical semiconductor channel that contacts the source contact layer; and a backside contact via structure contacting a sidewall of the source contact layer;

wherein the source-level material layers comprise a semiconductor material layer that is vertically spaced from the source contact layer by a source-level dielectric layer, and is electrically connected to the source contact layer by the backside contact via structure; and wherein each of the memory opening fill structures comprises a respective downward-protruding portion of the memory film that protrudes through a respective opening through the source-level dielectric layer and contacts a respective recessed surface of the semiconductor material layer.

18. The three-dimensional memory device of claim 17, wherein each of the downward-protruding portions of the memory film is adjoined to the lower horizontal portion of the memory film.

19. The three-dimensional memory device of claim 17, wherein a bottom surface of the lower horizontal portion of the memory film contacts a top surface of the source-level dielectric layer.

20. A method of forming a three-dimensional memory device, comprising:

forming in-process source-level material layers over a substrate, wherein the in-process source-level material layers comprise a source-level sacrificial layer;

forming an alternating stack of insulating layers and sacrificial material layers over the in-process source-level material layers;

forming memory openings through the alternating stack and into the in-process source-level material layers;

forming a backside trench through the alternating stack;

forming a source cavity by removing the source-level sacrificial layer;

forming a sacrificial backside trench fill structure in the backside trench prior to forming a memory film;

forming the memory film and a source contact layer in the source cavity and in the memory openings, wherein horizontal portions of the memory film and the source contact layer are formed in the source cavity and vertical portions of the memory film are formed in the memory openings;

forming vertical semiconductor channels and drain regions in remaining volumes of the memory openings;

forming a void within a volume of the backside trench after formation of the drain regions;

removing a sidewall portion of the memory film around the backside trench after forming the void within the volume of the backside trench, wherein the sidewall of the source contact layer sidewall is physically exposed; and forming a backside contact via structure in the backside trench directly on a sidewall of the source contact layer.

* * * * *